(12) United States Patent
Park et al.

(10) Patent No.: US 7,932,149 B2
(45) Date of Patent: Apr. 26, 2011

(54) METHOD OF MANUFACTURING A SEMICONDUCTOR DEVICE

(75) Inventors: Jae-Hyun Park, Yongin-si (KR); Jeong-Uk Han, Suwon-si (KR); Jae-Min Yu, Seoul (KR); Young-Cheon Jeong, Yongin-si (KR); Sang-Hoon Park, Hwaseong-si (KR); Kwan-Jong Roh, Gunpo-si (KR); Byeong-Cheol Lim, Busan (KR); Yong-Seok Chung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 78 days.

(21) Appl. No.: 12/453,676

(22) Filed: May 19, 2009

(65) Prior Publication Data

US 2009/0286369 A1    Nov. 19, 2009

(30) Foreign Application Priority Data

May 19, 2008    (KR) .................. 10-2008-0046000

(51) Int. Cl.
*H01L 21/336*    (2006.01)
(52) U.S. Cl. .................. 438/261; 257/E21.679
(58) Field of Classification Search .......... 257/E21.679, 257/E21.21, E21.423
See application file for complete search history.

(56) References Cited

U.S. PATENT DOCUMENTS

| | | | | |
|---|---|---|---|---|
| 6,133,098 | A * | 10/2000 | Ogura et al. ................. | 438/267 |
| 6,492,228 | B2 * | 12/2002 | Gonzalez et al. ............ | 438/257 |
| 6,706,599 | B1 * | 3/2004 | Sadd et al. ................... | 438/261 |
| 2006/0086967 | A1 * | 4/2006 | Hsieh et al. ................. | 257/314 |
| 2007/0187749 | A1 * | 8/2007 | Sugimae et al. ............. | 257/316 |
| 2009/0045445 | A1 * | 2/2009 | Yang et al. .................. | 257/299 |

FOREIGN PATENT DOCUMENTS

| | | |
|---|---|---|
| JP | 2002-237540 | 8/2002 |
| KR | 10-0532352 | 11/2005 |

* cited by examiner

*Primary Examiner* — Thao P. Le
(74) *Attorney, Agent, or Firm* — Harness, Dickey & Pierce, P.L.C.

(57) ABSTRACT

In a method of manufacturing a semiconductor device, a tunnel insulation layer is formed on a substrate. A charge trapping layer is formed on the tunnel insulation layer. A protection layer pattern or a mold is formed on the charge trapping layer. Charge trapping layer patterns are formed on the tunnel insulation layer by etching the charge trapping layer using the protection layer pattern or the mold. The charge trapping layer patterns may be spaced apart from each other. Blocking layers are formed on the charge trapping layer patterns, respectively. A gate electrode is formed on the blocking layers and the tunnel insulation layer using the protection layer pattern or the mold.

20 Claims, 16 Drawing Sheets

METHOD OF MANUFACTURING A SEMICONDUCTOR DEVICE

PRIORITY STATEMENT

This application claims priority under 35 U.S.C. §119 to Korean Patent Application No. 2008-46000, filed on May 19, 2008, in the Korean Intellectual Property Office (KIPO), the entire contents of which are hereby incorporated by reference.

BACKGROUND

1. Technical Field

Example embodiments relate to a semiconductor device and a method of manufacturing a semiconductor device. More particularly, example embodiments relate to a semiconductor device including charge trapping layer patterns separated from each other, and a method of manufacturing the semiconductor device.

2. Description of the Related Art

A conventional non-volatile semiconductor memory device, which can be electrically programmed and erased, generally a unit cell having a floating gate type. However, the floating gate type unit cell may not properly meet requires electrical characteristics and storage capacity according as the non-volatile semiconductor memory device has minute dimensions. Accordingly, a silicon-oxide-nitride-oxide-silicon (SONOS) type unit cell has been employed in a recent non-volatile semiconductor memory device instead of the floating gate type unit cell.

FIG. 1 is a cross sectional view illustrating a SONOS type unit cell of a conventional non-volatile semiconductor memory device.

Referring to FIG. 1, the conventional SONOS type unit cell usually include a tunnel oxide layer, a silicon oxide nitride layer, a silicon oxide layer and a control gate sequentially formed on a silicon substrate. The silicon nitride layer serves as a charge trapping layer. Impurity regions BL1 and BL2 serving bit lines are located at portions of the silicon substrate adjacent to the tunnel oxide layer.

As for the conventional SONOS type unit cell on the non-volatile semiconductor memory device, however, an electrical disturbance may occur between adjacent impurity regions BL1 and BL2 when the SONOS type unit cell has extremely minute dimensions to improve storage capacity of the recent non-volatile semiconductor memory device. Particularly, charges may not be properly transferred between the impurity regions BL1 and BL2 in the programming and erasing operations of the non-volatile semiconductor memory device, thereby deteriorating electrical characteristics and reliability of the non-volatile semiconductor memory device. Further, the conventional SONOS type unit cell has a planar cell structure in which a plurality of layers are vertically stacked, so that the conventional SONOS type unit cell may not sufficiently ensure fine cell dimensions required in a highly integrated semiconductor memory device.

SUMMARY

Example embodiments provide a semiconductor device including a SONOS type unit cell having separated charge trapping layer patterns to improve integration degree and electrical characteristics without an electrical disturbance between adjacent charge trapping layer patterns.

Example embodiments provide a method of manufacturing a semiconductor device having a SONOS type unit cell having separated charge trapping layer patterns to improve integration degree and electrical characteristics without an electrical disturbance between adjacent charge trapping layer patterns.

According to example embodiments, there is provided a method of manufacturing a semiconductor device. In the method of manufacturing the semiconductor device, a tunnel insulation layer is formed on a substrate, and a charge trapping layer is formed on the tunnel insulation layer. A protection layer pattern is formed on the charge trapping layer. Charge trapping layer patterns are formed on the tunnel insulation layer by etching the charge trapping layer using the protection layer pattern. The charge trapping layer patterns are separated from each other. Blocking layers are formed on the charge trapping layer patterns, respectively. A gate electrode is formed on the blocking layers and the tunnel insulation layer using the protection layer pattern.

In the formation of the charge trapping layer pattern according to example embodiments, first charge trapping layer patterns may be formed between the tunnel insulation layer and the protection layer pattern. Further, second charge trapping layer patterns may be formed on sidewalls of the first charge trapping layer patterns.

In example embodiments, the second charge trapping layer patterns may have round etched profiles, respectively. In example embodiments, the protection layer pattern and the first charge trapping layer patterns may be removed after forming the gate electrode. In example embodiments, gate spacers may be formed on sidewalls of the gate electrode, the charge trapping layer patterns and the blocking layers.

In example embodiments, the charge trapping layer may include nitride and the protection layer pattern may include oxide. In example embodiments, the blocking layers may include metal oxide and the gate electrode may include metal and/or metal compound. The charge trapping layer patterns may be formed by etching the charge trapping layer until the tunnel insulation layer is exposed. The blocking layers may be formed only on the charge trapping layer patterns. The blocking layers may be formed such that the blocking layers may not cover the tunnel insulation layer. The blocking layers may be formed such that the blocking layers may not cover side surfaces of sidewalls of the protection layer pattern. The blocking layers may be formed such that the blocking layers may not be formed on upper surfaces of the sidewalls of the protection layer pattern.

According to example embodiments, there is provided a method of manufacturing a semiconductor device. In the method of manufacturing the semiconductor device, a tunnel insulation layer is formed on a substrate, and at least one mold is formed on the tunnel insulation layer. A charge trapping layer is formed on the at least one mold and the tunnel insulation layer. Charge trapping layer patterns are formed on the tunnel insulation layer by etching the charge trapping layer using the at least one mold. The charge trapping layer patterns are spaced apart from each other. Blocking layers are formed on the charge trapping layer patterns, and a gate electrode is formed on the blocking layers and the tunnel insulation layer using the at least one mold. In example embodiments, the at least one mold may include polysilicon, carbon, silicon oxide, or silicon oxynitride.

In the formation of the at least one mold according to example embodiments, a mold layer may be formed on the tunnel insulation layer, and then the at least one mold may be obtained by patterning the mold layer. The charge trapping layer may be conformally formed along profiles of the at least one mold and the tunnel insulation layer.

In the formation of the at least one mold according to example embodiments, a mold layer may be formed on the tunnel insulation layer, and a first mold may be formed on a first portion of the tunnel insulation layer in a peripheral circuit area of the substrate. Second molds may be formed on a second portion of the tunnel insulation layer in a cell area of the substrate. The charge trapping layer patterns may be formed on sidewalls of the first mold and the second molds. Further, the first mold and the tunnel insulation layer may be partially removed to expose a portion of the substrate in the peripheral circuit area, and a gate insulation layer may be formed on the exposed portion of the substrate. An additional gate electrode may be on the gate insulation layer, and a first spacer may be formed on a sidewall of the additional gate electrode. Additionally, a second gate spacer may be formed on sidewalls of the gate electrode, the blocking layers and the charge trapping layer patterns.

According to example embodiments, there is provided a semiconductor device. The semiconductor device includes a tunnel insulation layer on a substrate, a gate electrode on the tunnel insulation layer, charge trapping layer patterns between the tunnel insulation layer and the gate electrode, wherein the charge trapping layer patterns are positioned beneath both sides of the gate electrode, blocking layers between the charge trapping layer patterns and the sides of the gate electrode.

In example embodiments, a total height of one charge trapping layer pattern and one blocking layer may be about 20 percent to about 50 percent of a height of the gate electrode.

In example embodiments, each of the charge trapping layer patterns may have a rounded shape. For example, each of the charge trapping layer patterns may have a spacer shape or a quadrant shape.

In example embodiments, a gate insulation layer may be located on a portion of a peripheral circuit area of the substrate wherein the tunnel insulation layer is located in a cell area of the substrate. An additional gate electrode may be provided on the gate insulation layer. A first spacer may be disposed on a sidewall of the additional gate electrode. Second spacers may be positioned on sidewalls of the gate electrode, the blocking layers and the charge trapping layer patterns.

According to example embodiments, the semiconductor device may include a unit cell having the charge trapping layer patterns spaced apart from each other, so that an electrical disturbance between adjacent bit lines may be effectively prevented or reduced and a side of the unit cell may be considerably reduced. Thus, the semiconductor device may ensure improved electrical characteristics and enhanced reliability. Additionally, the semiconductor device may be easily manufactured by simplified manufacturing processes using at least one protection layer pattern or at least one mold, such that the manufacturing cost and yield of the semiconductor device may be considerably reduced.

BRIEF DESCRIPTION OF THE DRAWINGS

Example embodiments can be understood in more detail from the following description taken in conjunction with the accompanying drawings, in which.

DETAILED DESCRIPTION OF EXAMPLE EMBODIMENTS

Figure 1:
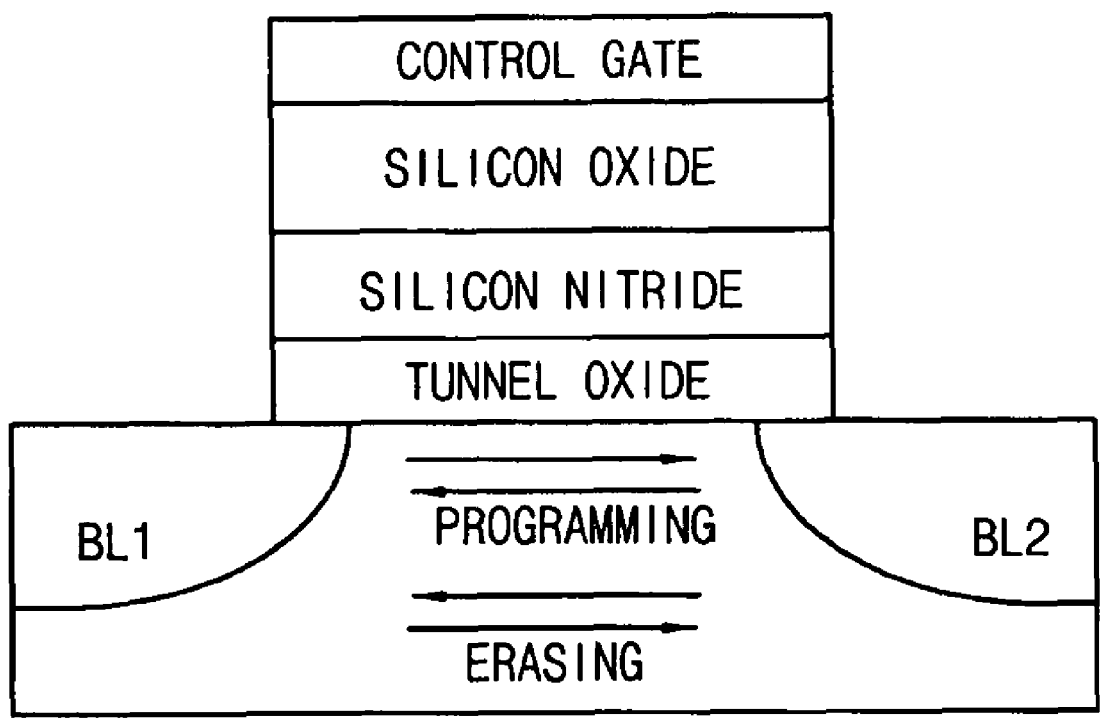
FIG. 1 is a cross sectional view illustrating a SONOS type unit cell of a conventional semiconductor memory device.

Example embodiments are described more fully hereinafter with reference to the accompanying drawings. The invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/ or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of illustratively idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 2 to 9 are cross sectional views illustrating a method of manufacturing a semiconductor device in accordance with example embodiments. FIGS. 2 to 9 illustrate a method of manufacturing a semiconductor memory device having a SONOS structure.

Figure 2:
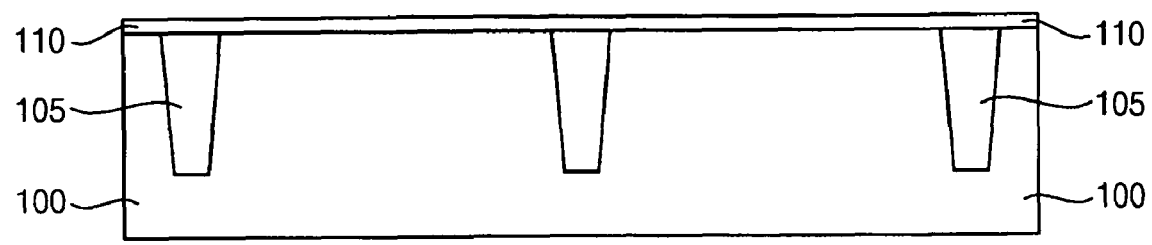
FIGS. 2 to 9 are cross sectional views illustrating a method of manufacturing a semiconductor device in accordance with example embodiments.

Referring to FIG. 2, an isolation layer 105 is formed on a substrate 100. The substrate 100 may include a semiconductor substrate, e.g., a silicon (Si) substrate, a germanium (Ge) substrate, or a silicon-germanium (Si-Ge) substrate. Alternatively, the substrate 100 may include a substrate having a semiconductor layer, e.g., a silicon-on-insulator (SOI) substrate or a germanium-on-insulator (GOI) substrate.

The isolation layer 105 may define an active region of the substrate 100 on which a semiconductor device is located. The isolation layer 105 may be formed using oxide, e.g., silicon oxide. For example, the isolation layer 105 may include undoped silicate glass (USG), spin on glass (SOG), flowable oxide (FOX), tetraethylorthosilicate (TEOS), plasma enhanced-TEOS (PE-TEOS), Tonen silazene (TOSZ), high density plasma-chemical vapor deposition (HDP-CVD) oxide, etc. Further, the isolation layer 105 may be obtained through an isolation process, e.g., a shallow trench isolation (STI) process or a thermal oxidation process.

A tunnel insulation layer 110 is formed on the substrate 100 having the isolation layer 105. The tunnel insulation layer 110 may be formed on the substrate 100 by a thermal oxidation process, a radical oxidation process, a chemical vapor deposition (CVD) process, a low pressure CVD (LPCVD) process, a plasma enhanced CVD (PECVD) process, an HDP-CVD process, etc. Additionally, the tunnel insulation layer 110 may include at least one oxide film and/or at least one oxynitride film. For example, the tunnel insulation layer 110 may include a silicon oxide (SiOx) film and a silicon oxynitride (SiOxNy) film sequentially formed on the substrate 100. Alternatively, the tunnel insulation layer 110 may include one silicon oxide film or one silicon oxynitride film.

In example embodiments, the tunnel insulation layer 110 may include a silicon oxide film obtained by the radical oxidation process. The tunnel insulation layer 110 may have a relatively thin thickness of about 50 Å to about 100 Å based on an upper face of the substrate 100. The tunnel insulation layer 110 may serve as a barrier layer for tunneling of charges from the substrate 100. When the tunnel insulation layer 110 includes silicon oxide obtained through the radical oxidation process, the tunnel insulation layer 110 may ensure an improved durability of the semiconductor device.

Figure 3:
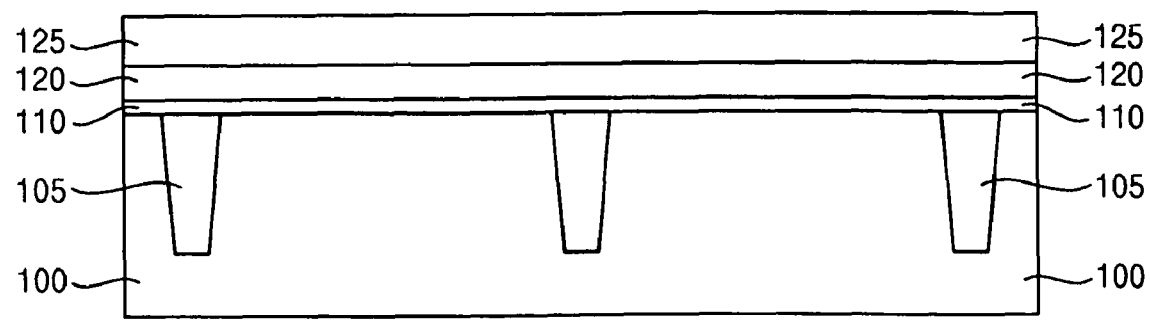

Referring to FIG. 3, a charge trapping layer 120 is formed on the tunnel insulation layer 110. The charge trapping layer 120 may have numerous charge trap sites for storing charges, e.g., electrons. The charge trapping layer 120 may be formed using nitride, for example, silicon nitride. The charge trapping layer 120 may be formed by a CVD process, an ALD process, a PECVD process, an LPCVD process, etc. Alternatively, the charge trapping layer 120 may have a multi layer structure that includes at least one oxide film and at least one nitride film. For example, the charge trapping layer 120 may include a lower nitride film, an oxide film and an upper nitride film.

Since the charge trapping layer 120 has the charge trap sites therein, the charges may be stored into the charge trap sites or emitted from the charge trap sites in an operation of the semiconductor device. When the charge trap sites of the charge trapping layer 120 including nitride have relatively deep energy level, the charges trapped in the charge trap sites may not emitted from the charge trap sites, so that the semiconductor device including the charge trapping layer 120 may ensure improved data retention ability. In example embodiments, the charge trapping layer 120 may have a thickness of about 100 Å to about 500 Å measured from an upper face of the tunnel insulation layer 110. The charge trapping layer 120 may include a first nitride film and a second nitride film. The first nitride film may have a thickness of about 50 Å to about 100 Å, and the second nitride film may have a thickness of about 50 Å to about 400 Å.

In some example embodiments, a plasma treatment may be performed on the charge trapping layer 120 to enhance electrical characteristics of the charge trapping layer 120. The plasma treatment process may be carried out using plasma generated from a nitrogen gas, a nitrogen oxide gas, an ammonia gas, etc.

A protection layer 125 is formed on the charge trapping layer 120. The protection layer 125 may be formed using oxide, e.g., silicon oxide by a CVD process, a PECVD process, an LPCVD process, an HDP-CVD process, etc. The protection layer 125 may protect the tunnel insulation layer 110 and the substrate 100 while etching the charge trapping layer 120 in a successive process. Further, the protection layer 125 may serve as a mold layer for forming a gate electrode 135 (see FIG. 7) in successive processes. Thus, the protection layer 125 may have a proper thickness considering a height of the gate electrode 135. For example, the protection layer 125 may have a thickness of about 1,000 Å to about 2,000 Å based on the charge trapping layer 120.

Figure 4:
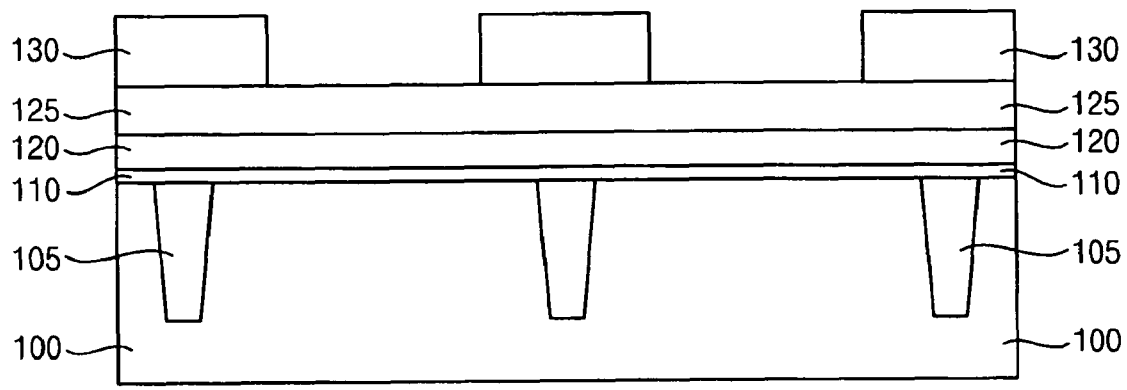

Referring to FIG. 4, a mask 130 is provided on the protection layer 125. The mask 130 may be formed using a material that has an etching selectivity with respect to the protection layer 125. For example, the mask 130 may include nitride, photoresist, or amorphous carbon. The mask 130 may be formed on the protection layer 125 by a photolithography process.

Figure 5:
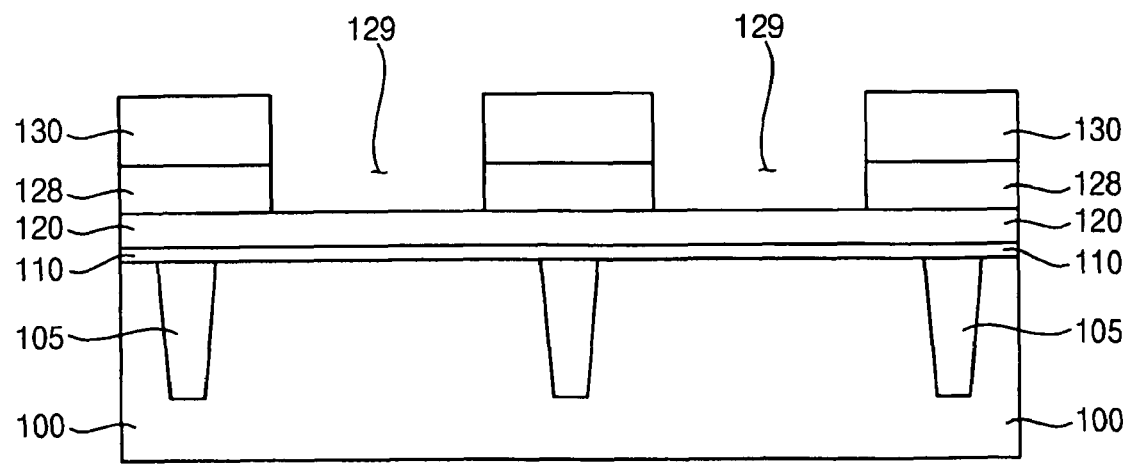

Referring to FIG. 5, the protection layer 125 is partially etched using the mask 130 as an etching mask, so that a protection layer pattern 128 and a recess 129 are provided on the charge trapping layer 120. The recess 129 may have dimensions considering a size of the gate electrode 135. For example, the recess 129 may have a predetermined width substantially corresponding to that of the gate structure. In other words, the width of the recess 129 may be adjusted by an interval between adjacent masks.

After formations of the protection layer pattern 128 and the recess 129, the mask 130 may be removed from the protection layer pattern 128. When the mask 130 includes photoresist, the mask 130 may be removed by an ashing process and/or a stripping process.

Figure 6:
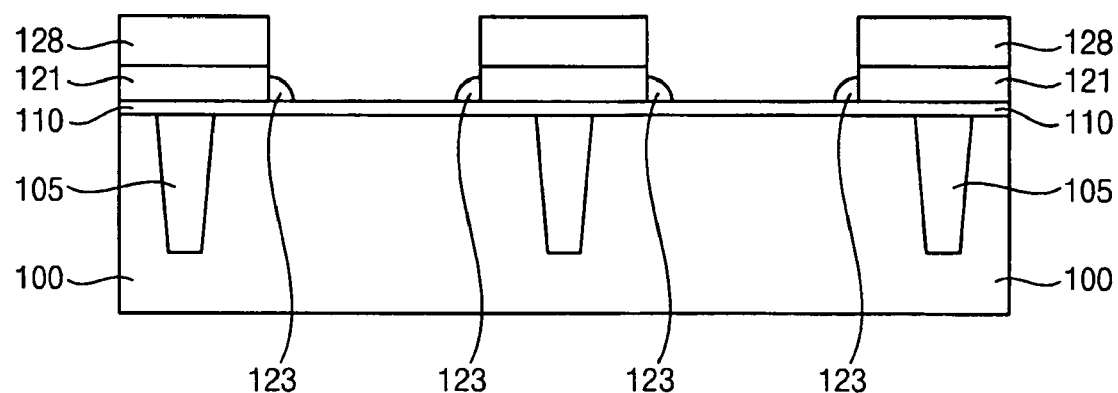

Referring to FIG. 6, the charge trapping layer 120 is partially etched using the protection layer pattern 128 as an etching mask until the tunnel insulation layer 110 is exposed, such that a first charge trapping layer pattern 121 and a second charge trapping layer pattern 123 are formed on the tunnel insulation layer 110.

In example embodiments, the charge trapping layer 120 may be etched by an anisotropic etching process. While anisotropically etching the charge trapping layer 120, a portion of the charge trapping layer 120 beneath a sidewall of the protection layer pattern 128 may be etched with an etching rate substantially different from that of other portions of the charge trapping layer 120. Thus, the second charge trapping layer pattern 123 may be formed on a sidewall of the first charge trapping layer pattern 121. The second charge trapping layer pattern 123 may have a round etched profile by adjusting process conditions of the anisotropic etching process. The second charge trapping layer pattern 123 may have a width of about 30 Å to about 100 Å by controlling the process conditions, e.g., a processing time, or an etchant. Further, the second charge trapping layer pattern 123 may have a height substantially lower that of the first charge trapping layer pattern 121.

In some example embodiments, the second charge trapping layer pattern 123 may be formed by etching an additional charge trapping layer after forming the additional layer on the tunnel insulation layer 110 to cover the protection layer pattern 128. The additional charge trapping layer may include a material substantially the same as or substantially similar to that of the charge trapping layer pattern 121.

Figure 7:
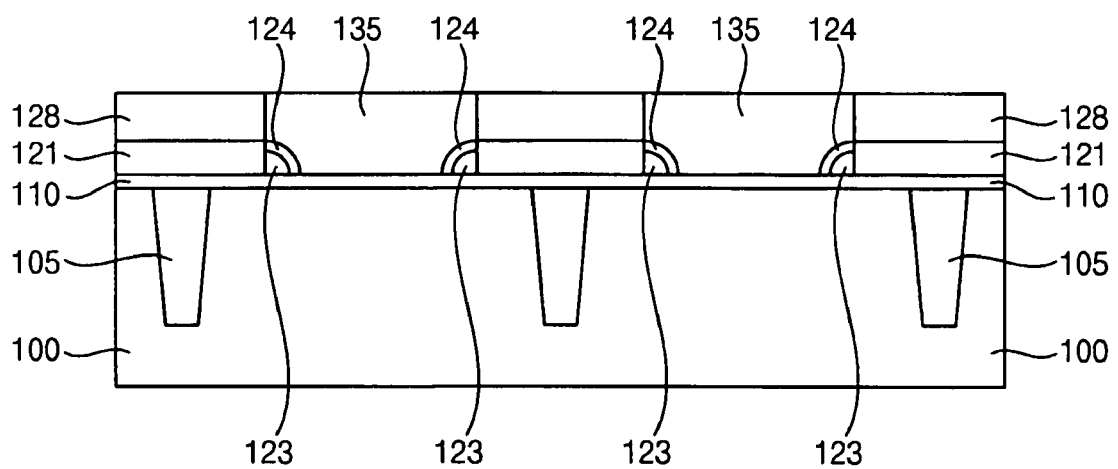

Referring to FIG. 7, a blocking layer 124 is formed only on the second charge trapping layer pattern 123. The blocking layer 124 may be formed using oxide or metal oxide having a relatively high dielectric constant. For example, the blocking layer 124 may include silicon oxide, aluminum oxide, hafnium oxide, zirconium oxide, tantalum oxide, etc. These may be used alone or in a mixture thereof. The blocking layer 124 may be obtained by a CVD process, an ALD process, a sputtering process, a pulsed laser deposition (PLD) process, an HDP-CVD process, an evaporation process, etc. The blocking layer 124 is formed such that the blocking layer 124 does not cover the tunnel insulation layer. The blocking layer 124 is formed such that the blocking layer 124 does not cover side surfaces of sidewalls of the protection layer pattern 128. The blocking layer 124 is formed such that the blocking layer 124 is not located on an upper surface of the sidewalls of the protection layer pattern 128.

In example embodiments, the blocking layer 124 may prevent or reduce charges from being injected into the second charge trapping layer pattern 123 when the semiconductor device does not operate. Further, the blocking layer 124 may prevent or reduce the emission of the charges stored in the second charge trapping layer pattern 123 when the semiconductor device does not perform a programming operation or an erasing operation. When the semiconductor device executes the programming operation or the erasing operation, an operation voltage may be sufficiently applied from the gate electrode 135 to the tunnel insulation layer 110 through the blocking layer pattern 124.

In some example embodiments, a total height of the blocking layer 124 and the second charge trapping layer pattern 123 may be substantially the same as or substantially similar to that of the first charge trapping layer pattern 121. Further, the total height of second charge trapping layer pattern 123 and the blocking layer 124 may be about 20 percent to about 50 percent of a height of the gate electrode 135.

The gate electrode 135 is formed on the blocking layer 124 and the tunnel insulation layer 110. The protection layer pattern 128 may serve as the mold layer for forming the gate electrode 135 as described above. Thus, the gate electrode 135 may not be located on the protection layer pattern 128 and the first charge trapping layer pattern 121.

In example embodiments, the gate electrode 135 may include metal and/or metal compound having a work function above about 4.5 eV. For example, the gate electrode 135 may be formed using titanium nitride, tungsten nitride, tantalum nitride, tungsten, titanium, tantalum, tantalum carbon nitride, etc. These may be used alone or in a combination thereof. Alternatively, the gate electrode 135 may have a multi layer structure that includes at least one metal film and/or at least one metal compound film. For example, the gate electrode 135 may include a combination of a tungsten film and a tungsten nitride film, a tungsten film and a titanium nitride film, or a tungsten film and a tantalum nitride film.

In some example embodiments, the gate electrode 135 may include tantalum nitride having a work function above 4.5 eV when the blocking layer 124 includes metal oxide. If the blocking layer 124 includes metal oxide and the gate electrode 135 includes polysilicon, Fermi level of polysilicon may be fixed to cause Fermi-pinning effect in the gate electrode 135, thereby deteriorating electrical characteristics of the gate electrode 135. Hence, the gate electrode 135 may include metal compound and/or metal when the blocking layer 124 includes metal oxide having a high dielectric constant.

As the formation of the gate electrode 135, adjacent second charge trapping layer pattern 123 are separated by the gate electrode 135, so that any disturbance may not occur between adjacent bit lines. Meanwhile, the gate electrode 135 may have minute dimensions when the second charge trapping layer pattern 123 is formed after forming the recess 129 as described above.

Figure 8:
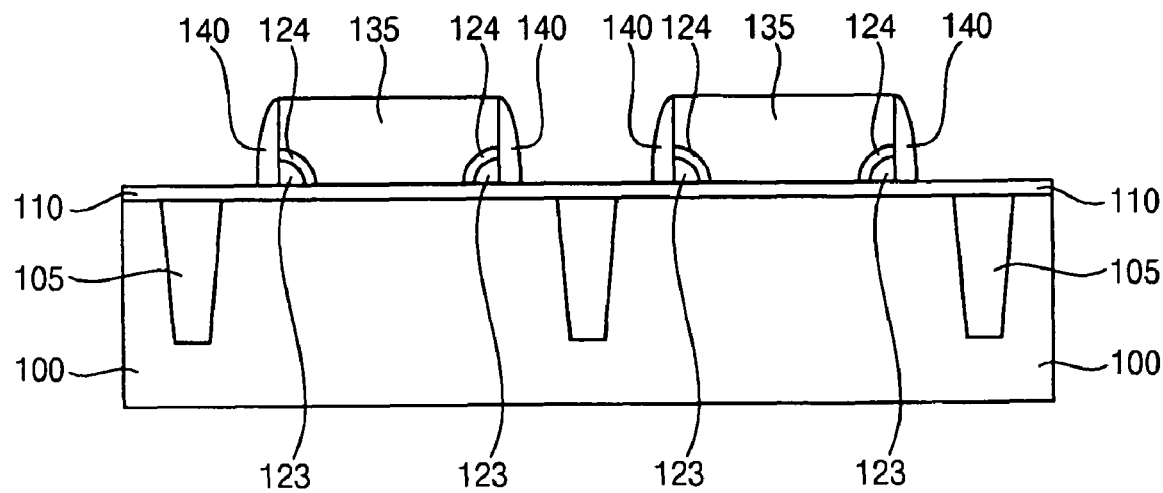

Referring to FIG. 8, the protection layer pattern 128 and the first charge trapping layer pattern 121 are removed from the tunnel insulation layer 110. The protection layer pattern 128 and the first charge trapping layer pattern 121 may be etched by an anisotropic etching process. The protection layer pattern 128 may be removed using an etchant containing fluorine, and the first charge trapping layer pattern 121 may be etched using an etching containing phosphoric acid.

When the protection layer pattern 128 and the first charge trapping layer pattern 121 are removed, sidewalls of the gate electrode 135, the blocking layer 124 and the second charge trapping layer pattern 123 are exposed.

A gate spacer 140 is formed on the sidewalls of the gate electrode 135, the blocking layer 124 and the second charge trapping layer pattern 123. The gate spacer 140 may be formed using oxide, e.g., silicon oxide, or oxynitride, e.g., silicon oxynitride. In example embodiments, the gate spacer 140 may be provided on the sidewalls of the gate electrode 135, the blocking layer 124 and the second charge trapping layer pattern 123 by partially etching a spacer formation layer after forming the spacer formation layer on the tunnel insulation layer 110 to cover the gate electrode 135. The spacer formation layer may be forming by a CVD process, a PECVD process, an LPCVD process or an HDP-CVD process, and may be anisotropically etched to form the gate spacer 140.

Figure 9:
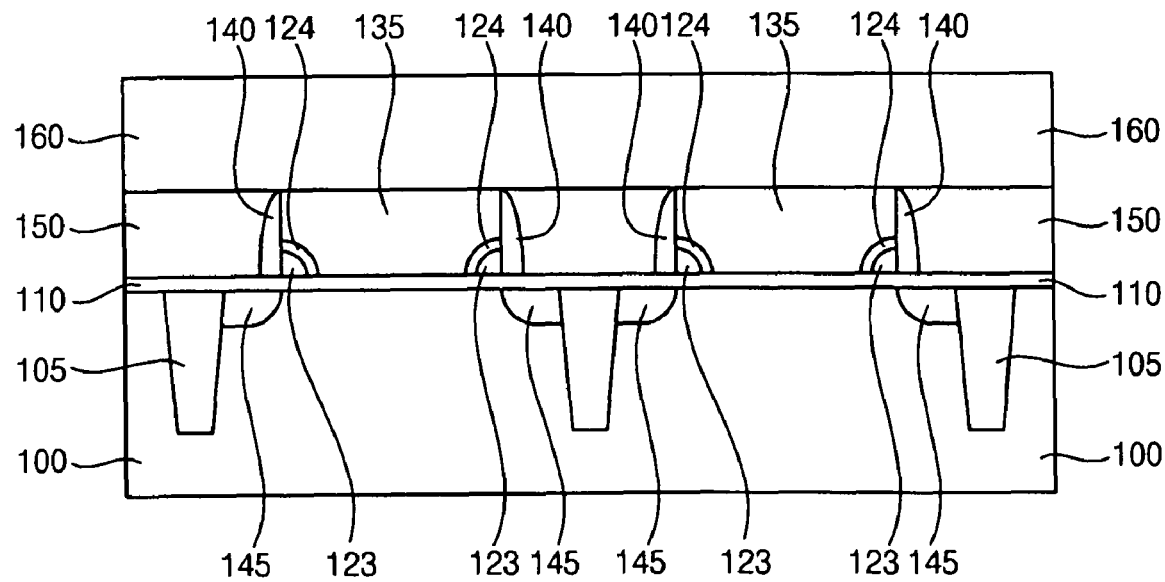

Referring to FIG. 9, an impurity region 145 is formed at a portion of the substrate 100 adjacent to the gate electrode 135. The impurity region 145 may be obtained by doping impurities into the portion of the substrate 100 through the tunnel insulation layer 110 using the gate electrode 135 and the gate spacer 140 as implantation masks. The impurity region 145 may serve as a source/drain region of the semiconductor device.

A first insulation layer 150 is formed on the tunnel insulation layer 110. The first insulation layer 150 may have a height substantially similar to that of the gate electrode 135. Hence, the gate electrode 135 may be exposed after the formation of the first insulation layer 150. Alternatively, the first insulation layer 150 may have a thickness that sufficiently covers the gate electrode 135 and the gate spacer 140. The first insulation layer 150 may be formed using oxide, e.g., silicon oxide by a CVD process, a PECVD process, an LPCVD process, an HDP-CVD process, etc. For example, the first insulation layer 150 may include USG, SOG, PSG, BPSG, TEOS, PE-TEOS, TOSZ, FOX, HDP-CVD oxide, etc.

In some example embodiments, the first insulation layer 150 may undergo a planarization process, e.g., a chemical mechanical polishing (CMP) process and/or an etch-back process. Thus, the first insulation layer 150 may have a flat upper face.

A second insulation layer 160 is provided on the first insulation layer 150. The second insulation layer 160 may include oxide, for example, USG, SOG, phosphor silicate glass (PSG), boro-phosphor silicate glass (BPSG), TEOS, PE-TEOS, TOSZ, FOX, HDP-CVD oxide, etc. Further, the second insulation layer 160 may be formed by a CVD process, a PECVD process, an LPCVD process, an HDP-CVD process, etc.

In example embodiments, the second insulation layer 160 may include oxide substantially the same as or substantially similar to that of the first insulation layer 150. Alternatively, the first and the second insulation layers 150 and 160 may be formed using different oxides, respectively.

In some example embodiments, the second insulation layer 160 may be planarized by a CMP process and/or an etch-back process. Hence, the second insulation layer 150 may also have a level upper face.

After the formation of the second insulation layer 160, a conductive contact (not illustrated) and a wiring (not illustrated) may be provided to form the semiconductor device on the substrate 100. The conductive contact and the wiring may be formed using polysilicon, metal and/or metal compound by a sputtering process, a CVD process, an ALD process, an evaporation process, a PLD process, etc. For example, the conductive contact and the wiring may include polysilicon doped with impurities, titanium, tungsten, aluminum, nickel, tantalum, copper, titanium nitride, tungsten nitride, aluminum nitride, nickel silicide, cobalt silicide, titanium silicide, etc. These may be used alone or in a mixture thereof.

FIGS. 10 to 16 are cross sectional views illustrating a method of manufacturing a semiconductor device in accordance with example embodiments. FIGS. 10 to 16 may illustrate a method of manufacturing another semiconductor memory device having a SONOS structure.

Figure 10:
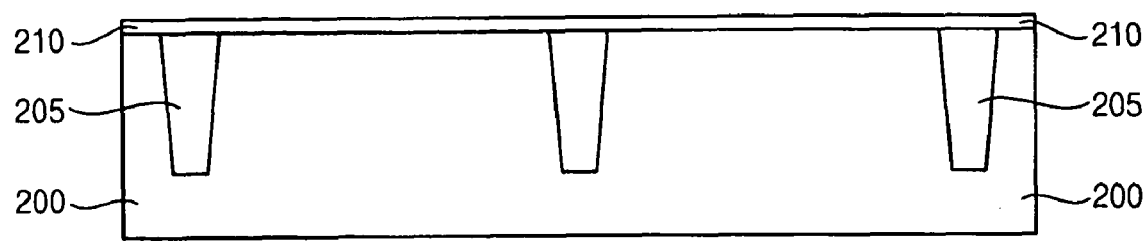
FIGS. 10 to 16 are cross sectional views illustrating a method of manufacturing a semiconductor device in accordance with example embodiments.

Referring to FIG. 10, after an isolation layer 205 is formed on a substrate 200, a tunnel insulation layer 210 is formed on the substrate 200 and the isolation layer 205. The substrate 200 may include a silicon substrate, a germanium substrate, a silicon-germanium substrate, an SOI substrate, a GOI substrate, etc. The isolation layer 205 may be formed using oxide, for example, USG, SOG, FOX, TEOS, PE-TEOS, TOSZ, HDP-CVD oxide, etc.

The tunnel insulation layer 210 may be formed by a thermal oxidation process, a radical oxidation process, a CVD process, an LPCVD process, a PECVD process, or an HDP-CVD process. The tunnel insulation layer 210 may include at least one oxide film and/or at least one oxynitride film. For example, the tunnel insulation layer 210 may have a silicon oxide film and/or a silicon oxynitride film.

When the tunnel insulation layer 210 includes silicon oxide obtained by the radical oxidation process, the tunnel insulation layer 210 may effectively serve as a barrier layer for tunneling of charges from the substrate 200. The tunnel insulation layer 210 may have a relatively thin thickness of about 50 Å to about 100 Å. Further, the tunnel insulation layer 210 may ensure an improved durability of the semiconductor device when the tunnel insulation layer 210 includes silicon oxide obtained through the radical oxidation process.

Figure 11:
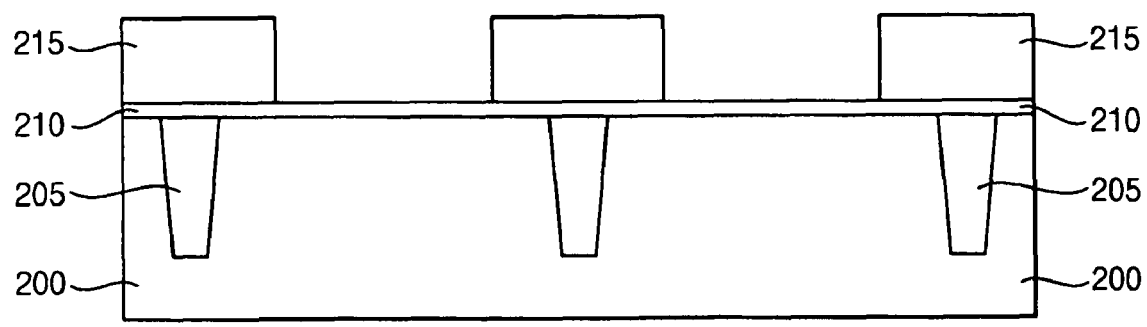

Referring to FIG. 11, a mold 225 is formed on the tunnel insulation layer 210. The mold 215 may be formed using a material that has an etching selectivity relative to nitride. For example, the mold 215 may include polysilicon, carbon, silicon oxide, or silicon oxynitride. The mold 215 may be formed by a CVD process, an ALD process, a PECVD process, an LPCVD process, an HDP-CVD process, etc. Alternatively, the mold 215 may have a multi layer structure. For example, the mold 215 may include a silicon oxide film, a polysilicon film and/or a silicon oxynitride film.

Figure 14:
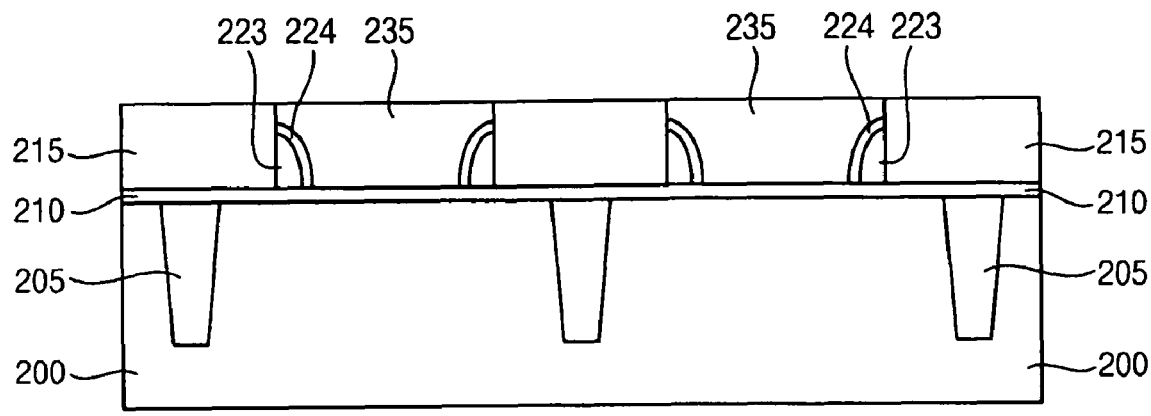

In example embodiments, the mold 215 may be provided for forming a gate electrode 235 (see FIG. 14). The mold 215 may be formed on the tunnel insulation layer 210 by patterning a mold layer (not illustrated) after forming the mold layer on the tunnel insulation layer 210. The mold layer may be patterned by a photolithography process. Alternatively, a hard mask (not illustrated) may be provided on the mold layer so as to etching the mold layer using the hard mask as an etching mask.

Figure 12:
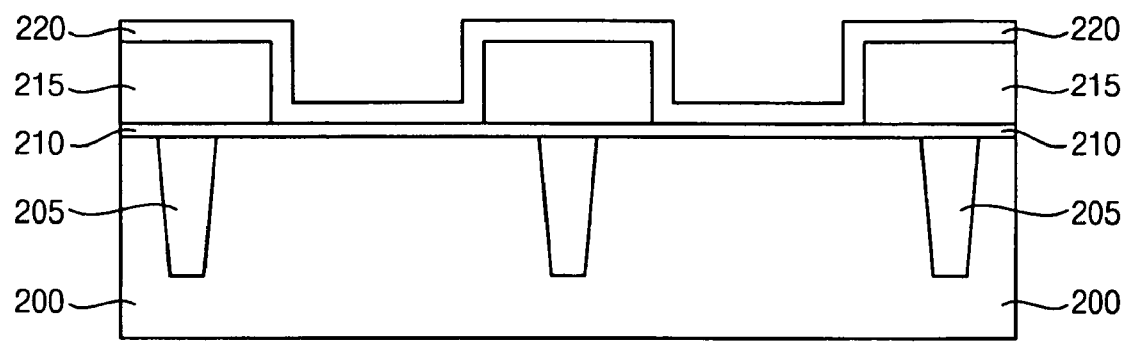

Referring to FIG. 12, a charge trapping layer 220 is formed on the mold 215 and the tunnel insulation layer 210. The charge trapping layer 220 may be uniformly formed along profiles of the mold 215 and the tunnel insulation layer 210. The charge trapping layer 220 may include nitride, e.g., silicon nitride. Alternatively, the charge trapping layer 220 may include at least one nitride film and at least one oxide film. For example, the charge trapping layer 220 may have a lower nitride film, an oxide film and an upper nitride film. The charge trapping layer 220 may be obtained by a CVD process, a PECVD process, an ALD process, an LPCVD process, etc.

In example embodiments, the charge trapping layer 220 may have much charge trap sites for storing charges therein. Hence, the charges may be stored into the charge trapping layer 220 or may be emitted from the charge trapping layer 220 in the programming and the erasing operations of the semiconductor device. The charge trapping layer 220 may have a thickness of about 100 Å to about 300 Å. When the charge trapping layer 220 includes silicon oxide, the charge trapping layer 220 may ensure the charge trap sites having deep energy levels so that the charges may not easily emitted from the charge trapping layer 220.

In some example embodiments, the charge trapping layer 220 may undergo a plasma treatment process using plasma generated from a gas including nitrogen. The charge trapping layer 220 may be treated by a direct plasma treatment process or a remote plasma treatment process.

Figure 13:
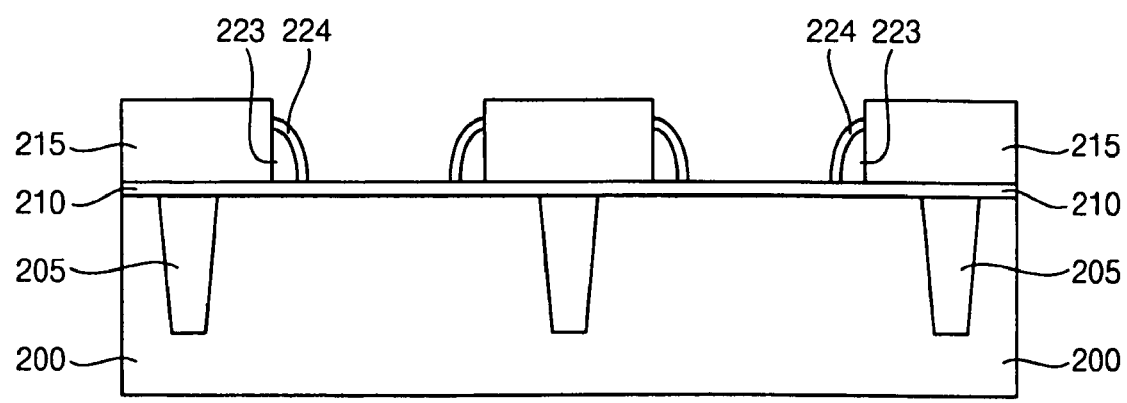

Referring to FIG. 13, the charge trapping layer 220 is partially etched to form a charge trapping layer pattern 223 on a sidewall of the mold 215 until the tunnel insulation layer 210 is exposed. The charge trapping layer pattern 223 may be obtained by an anisotropic etching process. The charge trapping layer pattern 223 may have a height substantially lower than a height of the mold 215. The charge trapping layer pattern 223 may have a minimum width above about 20 Å. For example, the charge trapping layer pattern 223 may have a width of about 20 Å to about 100 Å.

A blocking layer 224 is formed only on the charge trapping layer pattern 223. The blocking layer 224 may be formed using oxide or metal oxide having a high dielectric constant by a CVD process, an ALD process, a sputtering process, a PLD process, an HDP-CVD process, an evaporation process, etc. For example, the blocking layer 224 may include silicon oxide, aluminum oxide, hafnium oxide, zirconium oxide, tantalum oxide, etc. These may be used alone or in a mixture thereof. The blocking layer 224 is formed such that the blocking layer 224 is not covering the tunnel insulation layer 210. The blocking layer 224 is formed such that the blocking layer 224 does not cover side surfaces of sidewalls of the mold 215. The blocking layer 224 is formed such that the blocking layer 224 is not on an upper surface of the sidewalls of the mold 215.

The blocking layer 224 may prevent or reduce charges from being injected into the charge trapping layer pattern 223 when the semiconductor device does not operate. Additionally, the blocking layer 224 may prevent or reduce the emission of the charges stored in the charge trapping layer pattern 223 when the semiconductor device does not perform a programming operation or an erasing operation. When the semiconductor device executes the programming operation or the erasing operation, an operation voltage may be applied from the gate electrode 235 to the tunnel insulation layer 210 through the blocking layer pattern 224.

In some example embodiments, a total height of the blocking layer 224 and the charge trapping layer pattern 223 may be substantially smaller than that of the mold 215. Meanwhile, the blocking layer 224 may be provided on the tunnel insulation layer 210 and the mold 215.

Referring to FIG. 14, the gate electrode 235 is formed on the blocking layer 224 and the tunnel insulation layer 210. When the total height of the charge trapping layer pattern 223 and the blocking layer 224 is smaller than that of the mold 215, the gate electrode 235 may make contact with an upper side of the mold 215.

In example embodiments, the gate electrode 235 may be formed using metal and/or metal compound, which may have a work function above about 4.5 eV. For example, the gate electrode 235 may include titanium nitride, tungsten nitride, tantalum nitride, tungsten, titanium, tantalum, tantalum carbon nitride, etc. These may be used alone or in a combination thereof.

In some example embodiments, the gate electrode 235 may have a multi layer structure including at least one metal film and/or at least one metal compound film. For example, the gate electrode 235 may include a tungsten film and a tungsten nitride film or a tungsten film and a titanium nitride film. Alternatively, the gate electrode 235 may include a tungsten film, a titanium nitride film and a tantalum nitride film.

If the blocking layer 224 includes metal oxide and the gate electrode 235 includes polysilicon, Fermi level of polysilicon in the gate electrode 235 may be fixed to cause Fermi-pinning effect of the gate electrode 235. When the Fermi-pinning effect is generated in the gate electrode 235, the gate electrode 235 may have deteriorated electric characteristics. Thus, the gate electrode 235 may include tantalum nitride having a relatively high work function above 4.5 eV when the blocking layer 224 includes metal oxide, to thereby improve electric characteristics of the semiconductor device having the gate electrode 235 and the blocking layer 224.

In example embodiments, adjacent charge trapping layer patterns are separated from each other by the gate electrode 235, such that the electrical disturbance may not be generated between adjacent bit lines. Further, the gate electrode 235 may have minute dimensions when the charge trapping layer pattern 223 is formed after forming a recess between adjacent molds by processes substantially similar to those described with reference to FIGS. 5 and 6.

In some example embodiments, a gate mask (not illustrated) may be provided on the gate electrode 235. The gate mask may be formed using a material that has an etching selectivity relative to oxide. For example, the gate mask may include nitride, e.g., silicon nitride.

Figure 15:
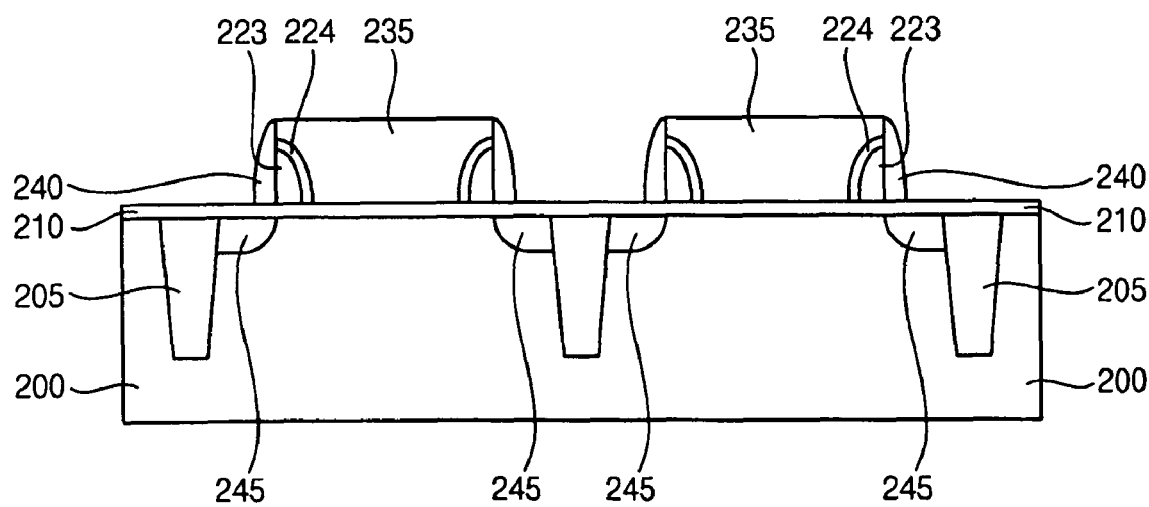

Referring to FIG. 15, the mold 215 is removed from the tunnel insulation layer 210. When the mold 215 includes silicon, the mold 215 may be etched using an etchant that includes fluorine. The mold 215 may be removed by a wet etching process or a dry etching process. For example, the mold 215 may be etched by the dry etching process using an etch gas including hydrogen fluoride.

After removing the mold 215 from the tunnel insulation layer 210, sidewalls of the gate electrode 235, the blocking layer 224 and the charge trapping layer pattern 223 are exposed. A gate spacer 240 is formed on the exposed sidewalls of the gate electrode 235, the blocking layer 224 and the charge trapping layer pattern 223. The gate spacer 240 may include oxide, e.g., silicon oxide or oxynitride like silicon oxynitride.

In example embodiments, a spacer formation layer may be conformally formed on the tunnel insulation layer 210, and then the spacer formation layer may be partially etched to provide the gape spacer 240 on the sidewalls of the gate electrode 235, the blocking layer 224 and the charge trapping layer pattern 223. The spacer formation layer may be forming by a CVD process, a PECVD process, an LPCVD process, an HDP-CVD process, etc.

An impurity region 245 serving as a source/drain region of the semiconductor device is formed at a portion of the substrate 200 adjacent to the gate electrode 235. The impurity region 245 may be formed by implanting impurities into the portion of the substrate 200 through the tunnel insulation layer 210. The gate electrode 235 and the gate spacer 240 may serve as ion implantation masks.

Figure 16:
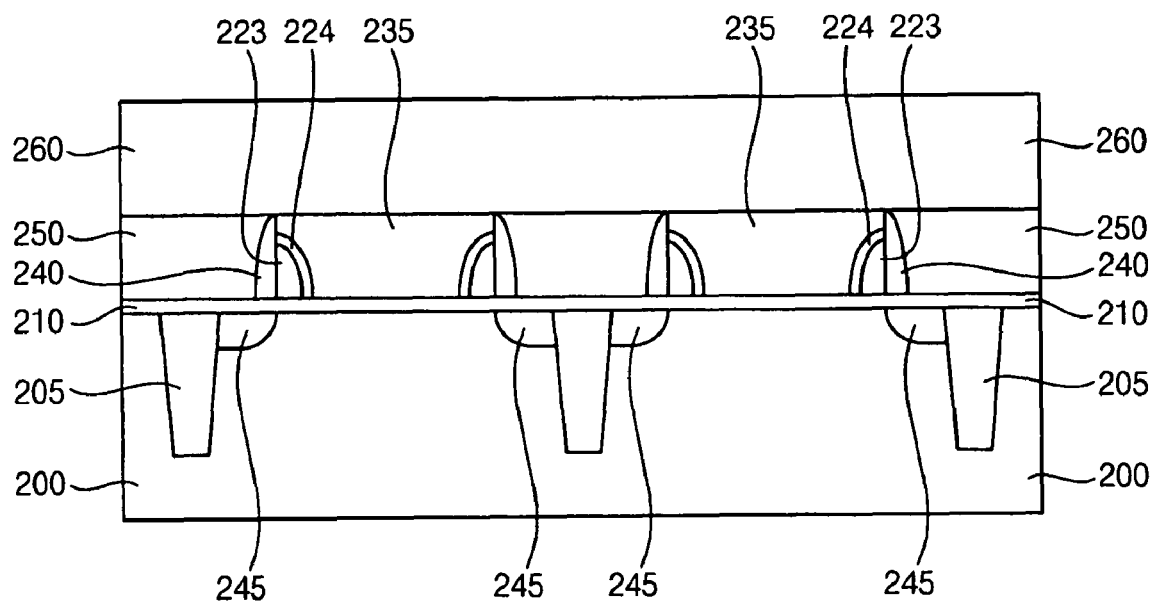

Referring to FIG. 16, a first insulation layer 250 is formed on the tunnel insulation layer 250 using oxide by a CVD process, a PECVD process, an LPCVD process, an HDP-CVD process, etc. For example, the first insulation layer 250 may include USG, SOG, PSG, BPSG, TEOS, PE-TEOS, TOSZ, FOX, HDP-CVD oxide, etc. The first insulation layer 250 may be partially removed until the gate electrode 235 is exposed. The first insulation layer 250 may be planarized by a CMP process and/or an etch-back process.

A second insulation layer 260 is provided on the first insulation layer 250 using oxide, e.g., USG, SOG, PSG, BPSG, TEOS, PE-TEOS, TOSZ, FOX, HDP-CVD oxide, etc. The second insulation layer 260 may also be formed by a CVD process, a PECVD process, an LPCVD process, an HDP-CVD process, etc. The second insulation layer 260 may include oxide substantially the same as or substantially similar to that of the first insulation layer 250. Alternatively, the second insulation layer 260 may be formed using oxide different from that of the first insulation layer 250. The second insulation layer 260 may also be planarized by a CMP process and/or an etch-back process.

After forming the second insulation layer 260 on the first insulation layer 250, a conductive contact (not illustrated) and a wiring (not illustrated) may be formed on the second insulation layer 260 to form the semiconductor device on the substrate 200. The conductive contact and the wiring may be formed using polysilicon, metal and/or metal compound by a sputtering process, a CVD process, an ALD process, an evaporation process, or a PLD process. For example, the conductive contact and the wiring may include polysilicon doped with impurities, titanium, tungsten, aluminum, nickel, tantalum, copper, titanium nitride, tungsten nitride, aluminum nitride, nickel silicide, cobalt silicide, titanium silicide, etc. These may be used alone or in a mixture thereof.

FIGS. 17 to 26 are cross sectional views illustrating a method of manufacturing a semiconductor device in accordance with example embodiments. FIGS. 10 to 16 may illustrate a method of manufacturing a NAND type flash memory device having a SONOS structure.

Figure 17:
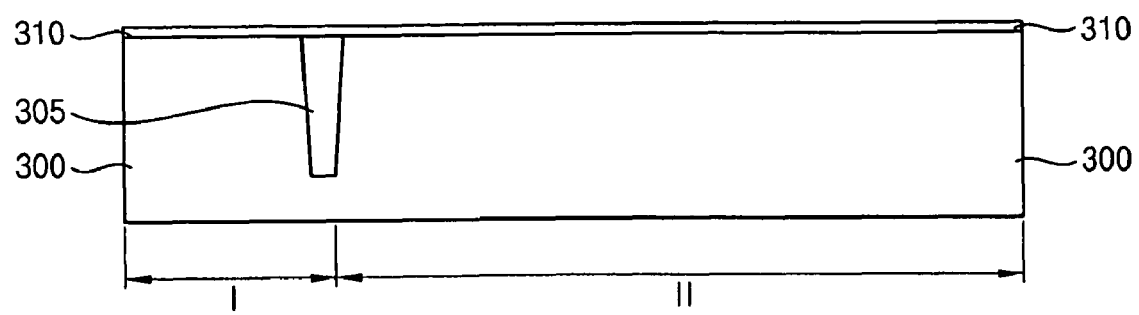
FIGS. 17 to 26 are cross sectional views illustrating a method of manufacturing a semiconductor device in accordance with example embodiments.

Referring to FIG. 17, a tunnel insulation layer 310 is formed on the substrate 300 having an isolation layer 305. The substrate 300 may be divided into a peripheral circuit area I and a cell area II. SONOS type unit cells of the semiconductor device may be provided in the cell area II of the substrate 300, and high voltage transistors and general transistors may be formed in the peripheral circuit area I.

The substrate 300 may include a silicon substrate, a germanium substrate, a silicon-germanium substrate, an SOI substrate, or a GOI substrate. The isolation layer 305 may be formed using oxide, for example, USG, SOG, FOX, TEOS, PE-TEOS, TOSZ, or HDP-CVD oxide. The tunnel insulation layer 310 may include at least one oxide film and/or at least one oxynitride film obtained by a thermal oxidation process, a radical oxidation process, a CVD process, an LPCVD process, a PECVD process, an HDP-CVD process, etc. The tunnel insulation layer 310 may have a relatively thin thickness of about 50 Å to about 100 Å. The tunnel insulation layer 310 may ensure an enhanced durability of the semiconductor device when the tunnel insulation layer 310 includes silicon oxide formed by a radical oxidation process.

A NAND type flash memory device usually includes a low decoder, a memory cell array, a sense amplifier, or a source line driver. The memory cell array may include word lines, bit lines, string memory cells electrically connected to the word and bit lines, and selection transistors. The low decoder may have word lines, selection gate lines and a peripheral decoder circuit. The sense amplifier may be electrically connected to the memory cells to read and amplify a signal from a selected memory cell. The source line driver may apply a power to a source line. When the SONOS unit cell is employed in the NAND type flash memory device, the high voltage transistors in the peripheral decoder circuit may be located in the peripheral circuit area I. Further, about 16 to about 32 transistors of the SONOS unit cell may be positioned in the cell area II.

Figure 18:
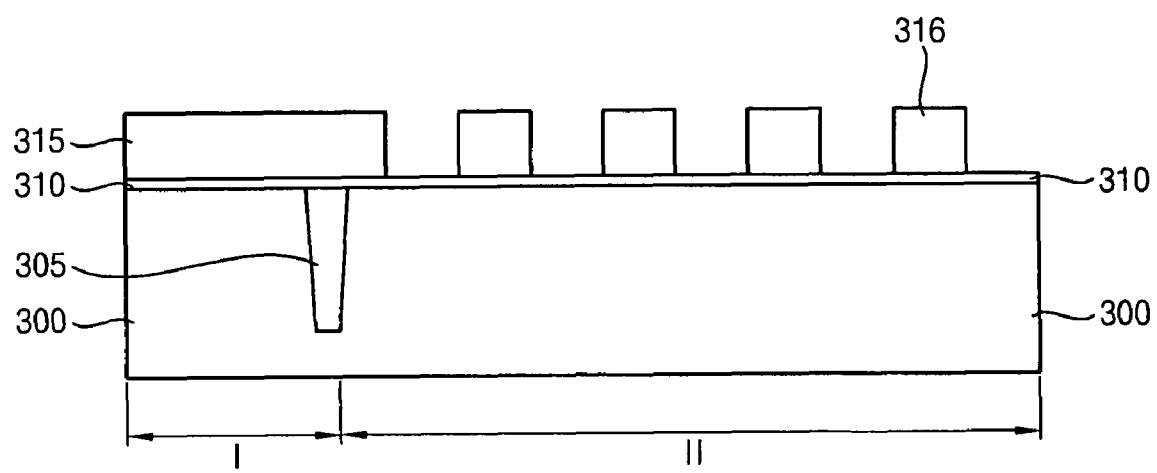

Referring to FIG. 18, a first mold 315 and second molds 316 are formed on the tunnel insulation layer 310. The first and the second molds 315 and 316 may be formed using polysilicon, carbon, silicon oxide, or silicon oxynitride.

In example embodiments, the first mold 315 may cover a first portion of the tunnel insulation layer 310 in the peripheral circuit area. Openings may be provided between the first mold 315 and the second mold 316 and between adjacent second molds 316 formed on a second portion of the tunnel insulation layer 310 in the cell area II. When the SONOS unit cell includes about 16 to about 32 transistors, about 16 to about 32 openings may be provided to expose the second portion of the tunnel insulation layer 310. However, the number of the openings may vary in accordance with the storage capacity of the semiconductor device.

In some example embodiments, the second molds 316 may be obtained a double patterning process to ensure the openings having minute widths when the semiconductor device is highly integrated. Each of the second molds 316 may have a width substantially smaller that that of the first mold 315.

Figure 19:
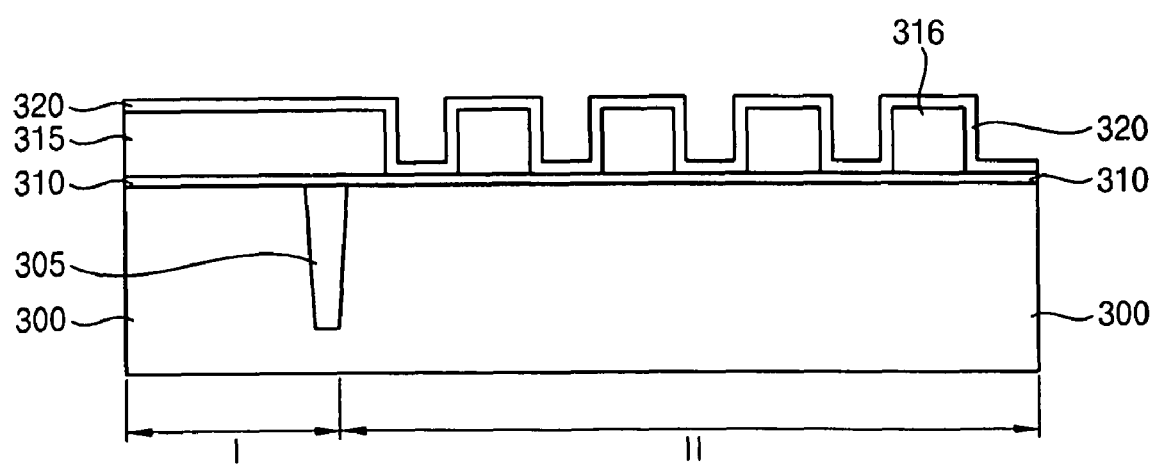

Referring to FIG. 19, a charge trapping layer 320 is formed on the first mold 315, the second molds 316 and the tunnel insulation layer 310. The charge trapping layer 320 may be conformally formed along profiles of the first mold 315, the second molds 316 and the tunnel insulation layer 310. The charge trapping layer 320 may include nitride, e.g., silicon nitride. Alternatively, the charge trapping layer 320 may include at least one nitride film and at least one oxide film. The charge trapping layer 320 may be formed by a CVD process, a PECVD process, an ALD process or an LPCVD process.

In example embodiments, the charge trapping layer 320 may include much charge trap sites for storing charges therein during the programming and the erasing operations of the semiconductor device. The charge trapping layer 320 may have a thickness of about 100 Å to about 300 Å based on an upper face of the tunnel insulation layer 310. When the charge trapping layer 320 includes silicon oxide, the charge trapping layer 320 may ensure the charge trap sites having deep energy levels so that the charges may not easily emitted from the charge trapping layer 320.

In some example embodiments, the charge trapping layer 320 may undergo a plasma treatment process using plasma generated from a gas including nitrogen. For example, the charge trapping layer 320 may be treated by a direct plasma treatment process or a remote plasma treatment process.

Figure 20:
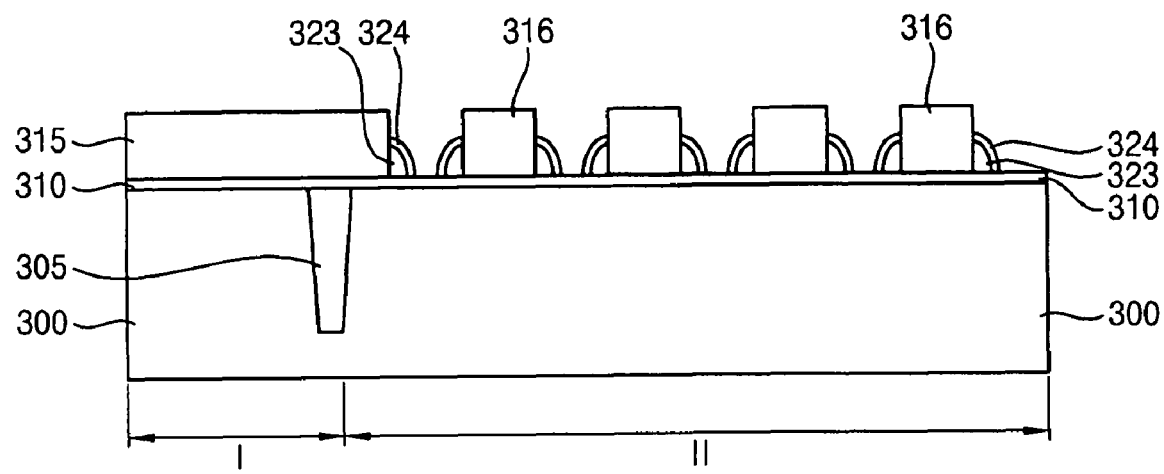

Referring to FIG. 20, the charge trapping layer 320 is anisotropically etched to form charge trapping layer patterns 323 on sidewalls of the first mold 315 and the second molds 316 until the tunnel insulation layer 310 is exposed. Each of the charge trapping layer patterns 323 may have a height substantially lower than those of the first and the second molds 315 and 316. Further, each of the charge trapping layer patterns 323 may have a minimum width above about 20 Å, for example, a width of about 20 Å to about 100 Å. In example embodiments, the charge trapping layer patterns 323 may have rounded shapes, respectively. Thus, each of the charge trapping layer patterns 323 may have a spacer shape, or a quadrant shape.

Blocking layers 324 are formed only on the charge trapping layer patterns 323, respectively. The blocking layers 324 may be formed using oxide or metal oxide having a high dielectric constant by a CVD process, an ALD process, a sputtering process, a PLD process, an HDP-CVD process, or an evaporation process. For example, the blocking layers 324 may be formed using silicon oxide, aluminum oxide, hafnium oxide, zirconium oxide, or tantalum oxide. These may be used alone or in a mixture thereof. Blocking layers 324 are formed such that the blocking layers 324 are not covering the tunnel insulation layer 310. The blocking layers 324 are formed such that the blocking layers 324 do not cover side surfaces of sidewalls of the first and second molds 315 and 316. The blocking layers 324 are formed such that the blocking layers 324 are not on an upper surface of the sidewalls of the first and second molds 315 and 316.

The blocking layers 324 may prevent or reduce charges from being injected into the charge trapping layer patterns 323 when the semiconductor device does not exist in the programming operation or the erasing operation. Further, the blocking layers 324 may prevent or reduce the emission of the charges stored in the charge trapping layer patterns 323 when the semiconductor device does not execute the programming operation or the erasing operation.

In some example embodiments, total heights of each blocking layers 324 and the charge trapping layer patterns 323 may be substantially smaller than those of the first and the second molds 315 and 316.

Figure 21:
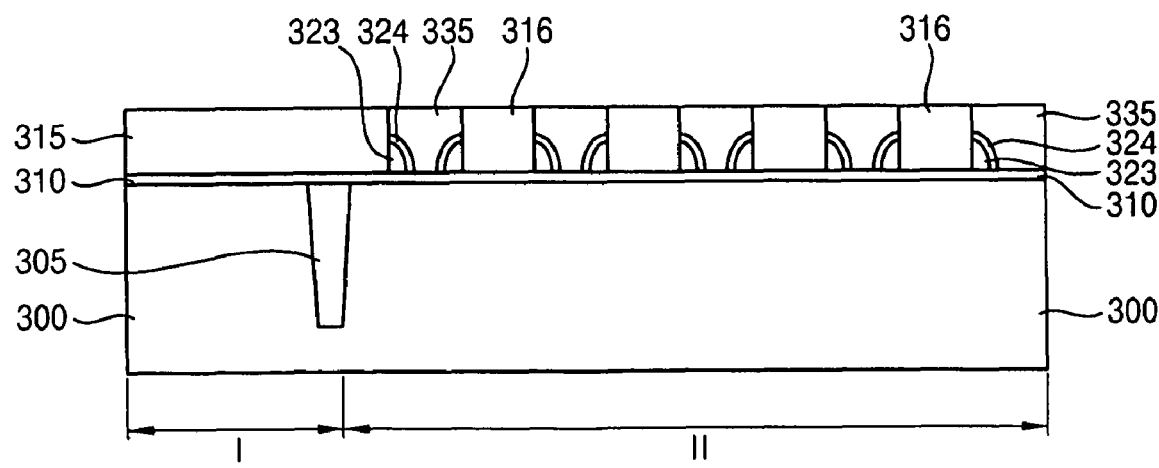

Referring to FIG. 21, gate electrodes 335 are formed on the blocking layers 324 and the tunnel insulation layer 310. When the total heights of the charge trapping layer patterns 323 and the blocking layers 324 are smaller than those of the first and the second molds 315 and 316, the gate electrodes 335 may make contact with upper sides of the first and the second molds 315 and 316. In example embodiments, each of the gate electrodes 335 may be formed using metal and/or metal compound, which may have a work function above about 4.5 eV. For example, each of the gate electrodes 335 may include titanium nitride, tungsten nitride, tantalum nitride, tungsten, titanium, tantalum, or tantalum carbon nitride. These may be used alone or in a combination thereof.

When the blocking layers 324 include metal oxide, the gate electrodes 335 may include tantalum nitride having a relatively high work function above 4.5 eV, so that electric characteristics of the semiconductor device having the gate electrodes 335 and the blocking layers 324 may be improved without Fermi-pinning effect in the gate electrodes 335.

As the formations of the gate electrodes 335, adjacent charge trapping layer patterns 323 are separated from each other by the gate electrodes 235, to thereby prevent or reduce the electrical disturbance between adjacent bit lines in the semiconductor device.

In some example embodiments, gate masks (not illustrated) may be provided on the gate electrodes 335, respectively. Each of the gate masks may be formed using a material that has an etching selectivity relative to oxide. For example, the gate masks may include nitride, e.g., silicon nitride.

Figure 22:
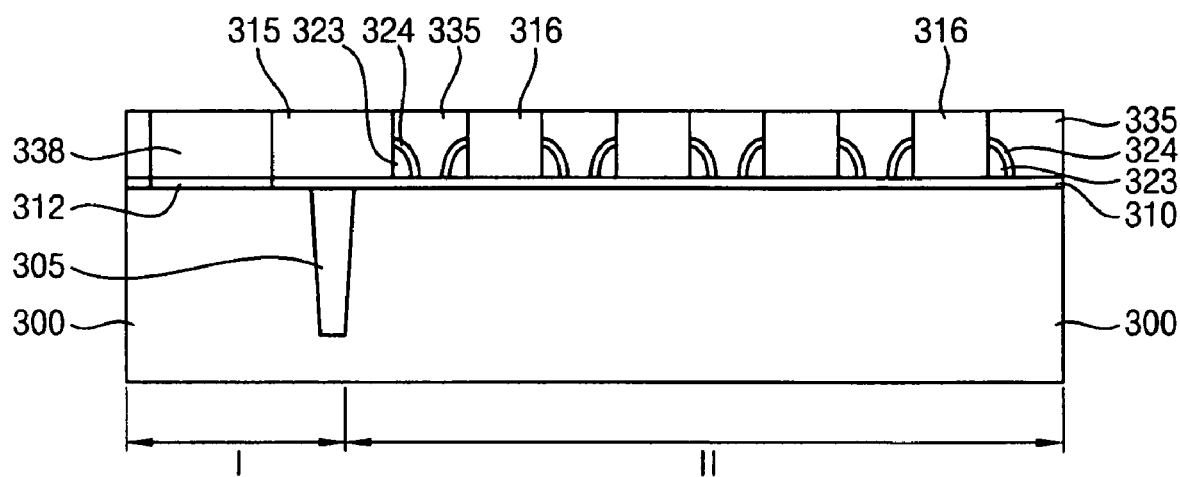

Referring to FIG. 22, the first mold 315 is partially removed from the first portion of the tunnel insulation layer 310 in the peripheral circuit area I. However, the second molds 316 are not removed at all in the cell area II. The first portion of the tunnel insulation layer 310 is partially removed together with a portion of the first mold 315, so that a portion of the substrate 300 is partially exposed in the peripheral circuit area I.

A gate insulation layer 312 is formed on the exposed portion of the substrate 300 in the peripheral circuit area I. The gate insulation layer 312 may be formed of oxide and/or metal oxide by a CVD process, an ALD process, a PECVD process, a sputtering process or an evaporation process. For example, the gate insulation layer 312 may include silicon oxide, hafnium oxide, aluminum oxide, tantalum oxide, zirconium oxide, titanium oxide, etc. These may be used alone of in a mixture thereof. When the gate insulation layer 312 includes metal oxide, the gate insulation layer 312 may be provided for the high voltage transistor in the peripheral circuit area I.

An additional gate electrode 338 is formed on the gate insulation layer 312 for the high voltage transistor in the peripheral circuit area I. The additional gate electrode 338 may include polysilicon, metal and/or metal compound obtained by a CVD process, an ALD process, a PECVD process, a sputtering process, a PLD process or an evaporation process. For example, the additional gate electrode 338 may be formed using polysilicon doped with impurities, tungsten, titanium, tantalum, aluminum, copper, tungsten nitride, tungsten silicide, titanium nitride, titanium silicide, tantalum nitride, tantalum silicide, aluminum nitride, cobalt silicide, etc. These may be used alone or in a combination thereof.

In example embodiments, the additional gate electrode 338 may have a height substantially the same as or substantially similar to that of the gate electrode 335 in the cell area II. Accordingly, the height of the additional gate electrode 338 may be substantially the same as or substantially similar to those of the first and the second molds 315 and 316.

Figure 23:
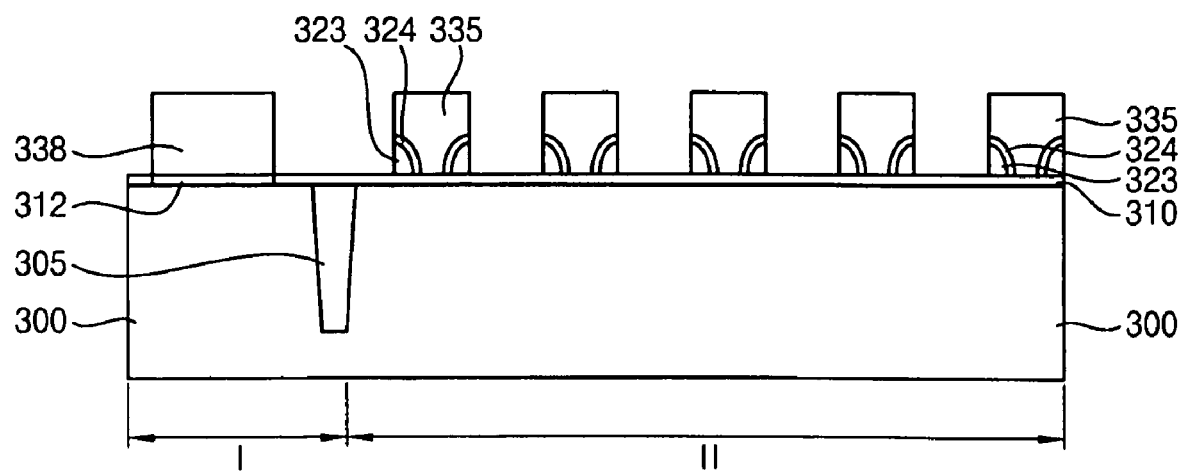

Referring to FIG. 23, the first and the second molds 315 and 316 are removed from the tunnel insulation layer 310 in the peripheral circuit and the cell areas I and II. The first and the second molds 315 and 316 may be etched by a wet etching process or a dry etching process. For example, the first and the second molds 315 and 316 may be removed by the dry etching process using an etch gas including hydrogen fluoride when the first and the second molds 315 and 316 include oxides.

When the first and the second molds 315 and 316 are removed from the tunnel insulation layer 310, sidewalls of the gate electrodes 335, the blocking layers 324, the charge trapping layer patterns 323 and the additional gate electrode 338 are exposed.

Figure 24:
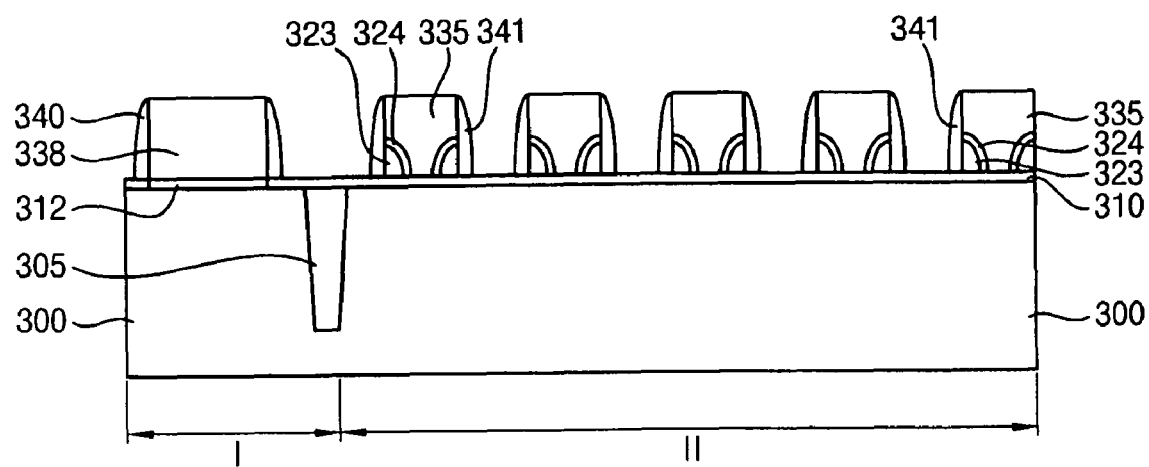

Referring to FIG. 24, a first gate spacer 340 is formed on the sidewall of the additional gate electrode 338, and second gate spacers 341 are formed on the sidewalls of the gate electrodes 335, the blocking layers 324 and the charge trapping layer patterns 323. The first and the second gate spacers 340 and 314 may be formed using oxide, e.g., silicon oxide, or oxynitride, e.g., silicon oxynitride.

Figure 25:
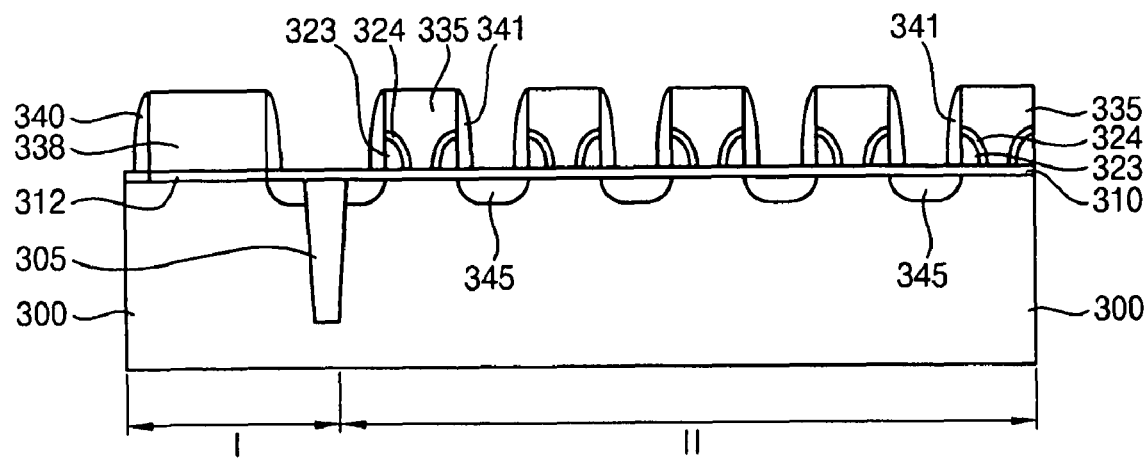

Referring to FIG. 25, impurity regions 345 may be formed at portions of the substrate 300 adjacent to the gate electrodes 335 and the additional gate electrode 338. The impurity regions 345 may be formed by implanting impurities into the portions of the substrate 300 using the gate electrodes 335 and the additional gate electrode 338 as implantation masks.

Figure 26:
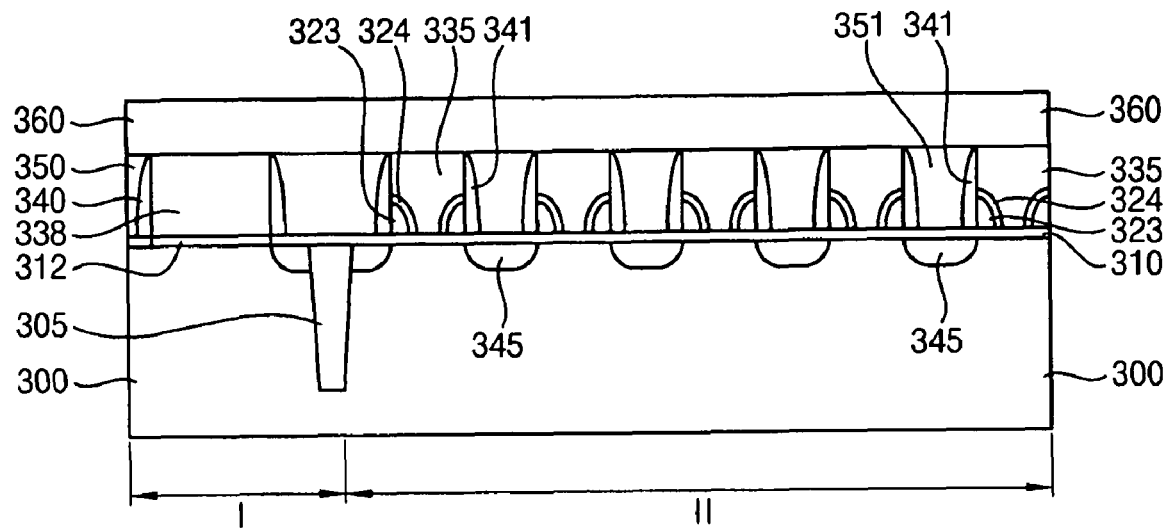

Referring to FIG. 26, a first insulation layer pattern 350 and second insulation layer patterns 351 are formed on the tunnel insulation layer 310 using oxide by a CVD process, a PECVD process, an LPCVD process or an HDP-CVD process. For example, the first and the second insulation layer patterns 350 and 351 may include USG, SOG, PSG, BPSG, TEOS, PE-TEOS, TOSZ, FOX, HDP-CVD oxide, etc.

In example embodiments, a first insulation layer may be formed on the tunnel insulation layer 310 to cover the gate electrodes 335 and the additional gate electrode 338. The first and the second insulation layer patterns 350 and 351 may be obtained by partially removing the first insulation layer until the gate electrodes 335 and the additional gate electrode 338 are exposed. The first and the second insulation layer patterns 350 and 315 may be obtained by a CMP process and/or an etch-back process. The first insulation layer pattern 350 may cover the peripheral circuit area I and the second insulation layer patterns 350 may cover the cell area II.

A second insulation layer 360 is provided on the first and the second insulation layer patterns 350 and 315 using oxide, e.g., USG, SOG, PSG, BPSG, TEOS, PE-TEOS, TOSZ, FOX or HDP-CVD oxide. The second insulation layer 360 may also be formed by a CVD process, a PECVD process, an LPCVD process or an HDP-CVD process. The second insulation layer 360 may include oxide substantially the same as or substantially similar to those of the first and the second insulation layer patterns 350 and 351. Alternatively, the second insulation layer 360 may be formed using oxide different from those of the first and the second insulation layer patterns 350 and 351. The second insulation layer 360 may also be planarized by a CMP process and/or an etch-back process.

After forming the second insulation layer 360 on the first and the second insulation layer patterns 350 and 351, a conductive contact and a wiring may be formed on the second insulation layer 360 to form the semiconductor device on the substrate 300. The conductive contact and the wiring may be formed using polysilicon, metal and/or metal compound by a sputtering process, a CVD process, an ALD process, an evaporation process or a PLD process.

Figure 27:
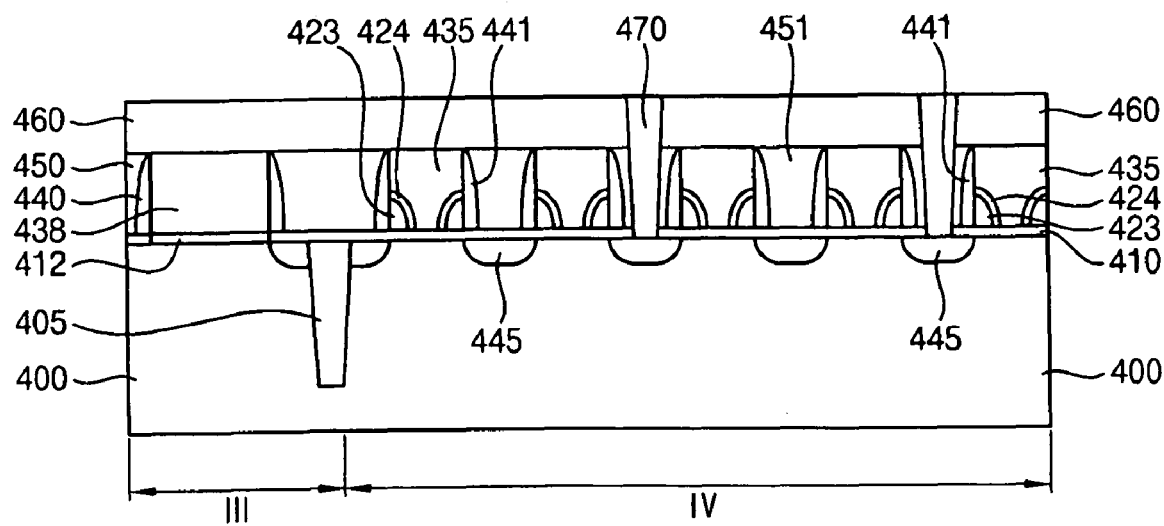
FIG. 27 is a cross sectional illustrating a semiconductor device in accordance with example embodiments.

FIG. 27 is a cross sectional view illustrating a semiconductor device in accordance with example embodiments. FIG. 27 illustrates a NOR type non-volatile semiconductor memory device. In the NOR type non-volatile semiconductor memory device, two transistors may be electrically connected to one bit line contact.

Referring to FIG. 27, the semiconductor device is provided on the substrate 400 having a peripheral circuit area III and the cell area IV. An isolation layer 405 is provided on the substrate 400 to define an active region and a field region of the substrate 400.

A tunnel insulation layer 410 is formed on a first portion of the substrate 400 in the cell area IV and a gate insulation layer 412 is located on a second portion of the substrate 400 in the peripheral circuit area III.

Gate electrodes 435 are formed on the tunnel insulation layer 410 in the cell area IV, and an additional gate electrode 438 is positioned on the gate insulation layer 412 in the peripheral circuit area III.

Charge trapping layer patterns 423 are located at both sides of the gate electrode 435, and blocking layers 424 are provided on the charge trapping layer patterns 423. That is, adjacent charge trapping layer patterns 423 and adjacent blocking layers 424 are separated from each other because the charge trapping layer patterns 423 and the blocking layers 424 are covered with the gate electrode 435. However, sidewalls of the charge trapping layer patterns 423 and the blocking layers 424 are exposed to an outside.

A first spacer 440 is formed on a sidewall of the additional gate electrode 438 in the peripheral circuit area III, and second spacers 441 are formed on the sidewalls of the gate electrodes 435, the charge trapping layer patterns 423 and the blocking layers 424.

Impurity regions 445 are provided at portions of the substrate 400 adjacent to the additional gate electrode 438 and the gate electrodes 435. The impurity regions 445 are positioned between adjacent gate electrodes 435 in the cell area IV.

A first insulation layer pattern 450 is formed in the peripheral circuit area III and second insulation layer patterns 451 are provided in the cell area IV. The first and the second insulation layer patterns 450 and 451 may enclose the additional gate electrode 438 and the gate electrodes 435, respectively.

A second insulation layer 460 is formed on the first and the second insulation layer patterns 450 and 451. Bit line contacts 470 are formed through the second insulation layer 460 and the second insulation layer patterns 451 in the cell area IV. The bit line contacts 470 may make contact with the impurity regions 445, respectively. Each of the bit lines contacts 470 may be formed using polysilicon, metal and/or metal compound by a sputtering process, a CVD process, an ALD process, an evaporation process, or a PLD process. For example, the bit line contacts 470 may include polysilicon doped with impurities, titanium, tungsten, aluminum, nickel, tantalum, copper, titanium nitride, tungsten nitride, aluminum nitride, nickel silicide, cobalt silicide, titanium silicide, etc. These may be used alone or in a mixture thereof.

As for the semiconductor device illustrated in FIG. 27, two gate electrodes 438 may be electrically connected to one bit line contact 470 through the impurity region 445. However, one gate electrode 438 may be electrically connected to one bit line contact by forming a plurality of bit line contacts through the second insulation layer 460 and the second insulation layer pattern 451.

A wiring making contact with the bit line contacts 470 may be formed on the second insulation layer 460 and the bit line contacts 470, and then an additional insulation layer may be provided on the wiring to form the semiconductor device on the substrate 400.

Figure 28:
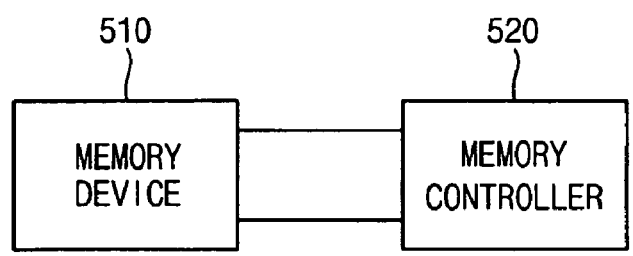
FIG. 28 is a block diagram illustrating a memory system in accordance with example embodiments.

FIG. 28 is a block diagram illustrating a memory system in accordance with example embodiments.

Referring to FIG. 28, the memory system includes a memory controller 520 and a memory device 510 electrically connected to the memory controller 520. The memory device 510 may include the semiconductor device having the gate structure and/or the additional gate structure formed through the above-described processes. For example, the memory device 510 may include a NAND type non-volatile semiconductor memory device or a NOR type non-volatile semiconductor memory device. Alternatively, the memory device 510 may include a volatile semiconductor memory device, e.g., a DRAM device, or an SRAM device.

The memory controller 520 may provide an input signal into the memory device 510 to control the reading and the erasing operations of the memory device 510. For example, various signals, e.g., command (CMD), address (ADD), input/output data (DQ) or a high-voltage (VPP) signal, may be applied to the memory controller 520. The memory controller 520 may control the memory device 510 based on the applied various signals. The memory system may be employed in various electronic apparatuses, e.g., a cellular phone, a portable multimedia player, or a digital camera.

Figure 29:
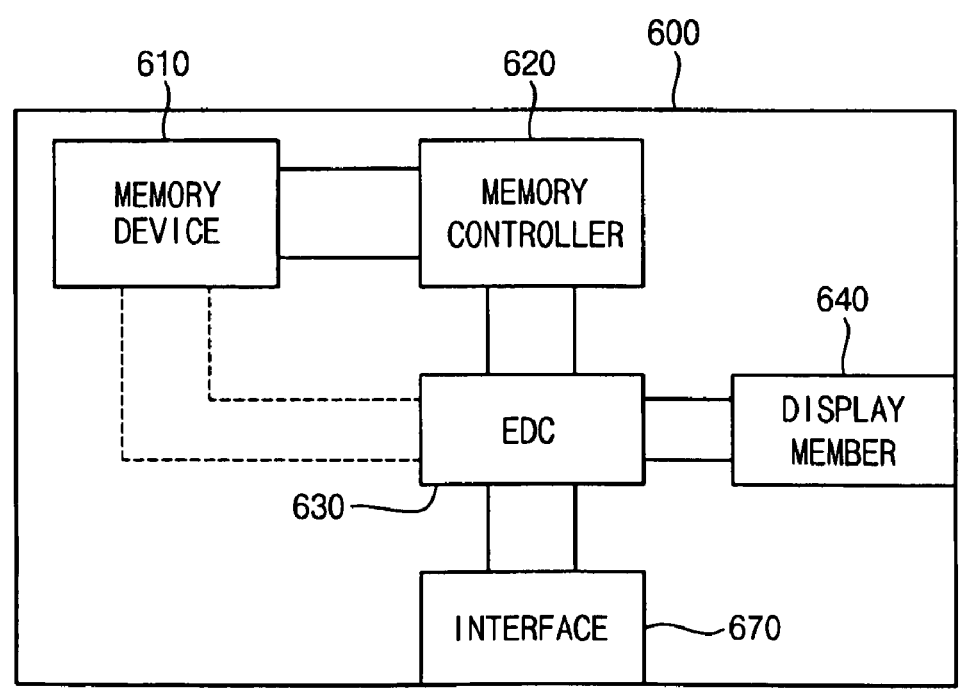
FIG. 29 is a block diagram illustrating another memory system in accordance with example embodiments.

FIG. 29 is a block diagram illustrating another memory system in accordance with example embodiments. Referring to FIG. 29, the memory system is used in a portable electronic apparatus 600. The portable electronic apparatus 600 may include an MP3 player, a portable video player, a portable multimedia player, or a digital camera. The memory system in the portable electronic apparatus 600 includes a memory device 610 and a memory controller 620. Further, the memory system includes an encoder/decoder (EDC) 630, a display member 640 and an interface 670. The memory device 610 may include the gate electrode including the separated charge trapping layer patterns as described above. Alternatively, the memory device 610 may include the gate electrode and the additional gate electrode.

The EDC 630 may input/output data, e.g., audio data or video data, into/from the memory device 610 through the memory controller 620. Alternatively, the data may be directly inputted from the EDC 630 into the memory device 610 or may be directly outputted from the memory device 610 into the EDC 630.

The EDC 630 may encode of the data stored in the memory device 610. For example, the EDS 630 may carry out encoding of MP3 files to store the audio data into the memory device 610. Alternatively, the EDC 630 may encode MPEG files to store the video data into the memory device 610. Further, the EDS 630 may include a compound encoder for encoding different file types of various data. For example, the EDC 630 may include an MP3 encoder for the audio data and an MPEG encoder for the video data.

The EDC 630 may decord the data from the memory device 610. For example, the EDC 630 may perform decoding of the MP3 files based on the audio data stored in the memory device 610. Alternatively, the EDC 630 may execute decoding of MPEG files from the video data stored in the memory device 610. Hence, the EDC 630 may include an MP3 decoder for the audio data and an MPEG decoder for the video data.

In example embodiments, the EDC 630 may include a decoder without an encoder. For example, encoded data may be inputted into the EDC 630, and then the encoded data may be directly stored into the memory device 610 or may be stored into the memory device 610 through the memory controller 620 when the EDC 630 has the decoder only.

In some example embodiments, the EDC 630 may receive data for encording or encoded data through the interface 670. The interface 670 may meet a predetermined or given reference, e.g., a fire wire or a USB. For example, the interface 670 may include a fire wire interface or a USB interface. Further, the data stored in the memory device 610 may be outputted through the interface 670.

The display member 640 may display the data outputted from the memory device 610 or the decorded data from the EDC 630. For example, the display member 640 may include a speaker jack to output the audio data and/or a display screen to display the video data.

Figure 30:
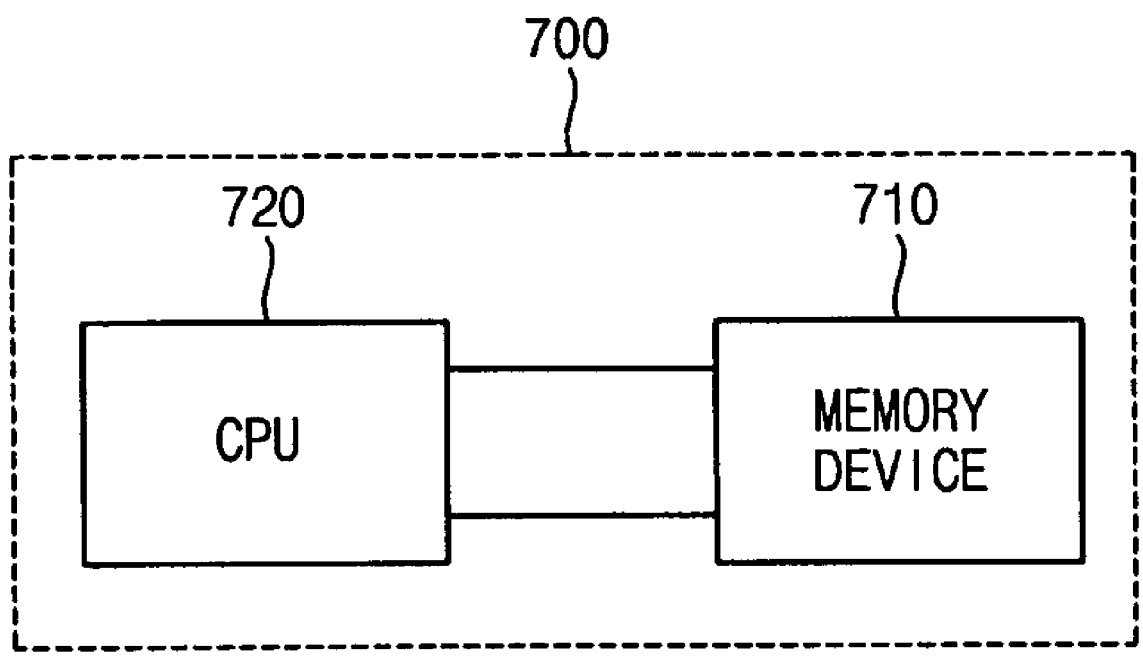
FIG. 30 is a block diagram illustrating still another memory system in accordance with example embodiments.

FIG. 30 is a block diagram illustrating still another memory system in accordance with example embodiments.

Referring to FIG. 30, the memory system includes a memory device 710 and a central processing unit (CPU) 720 in a computer system 700. The memory device 710 is electrically connected to the CPU 720. For example, the computer system 700 may include a personal computer, a personal data assistant, or a note book computer. The memory device 710 may be directly connected to the CPU 720 or may be electrically connected to the CPU 720 through a BUS.

According to example embodiments, a semiconductor device may include a unit cell having charge trapping layer patterns spaced apart from each other, so that an electrical disturbance between adjacent bit lines may be effectively prevented or reduced and a side of the unit cell may be considerably reduced. Therefore, the semiconductor device may ensure improved electrical characteristics and enhanced reliability. Further, the semiconductor device may be easily manufactured by simplified manufacturing processes using at least one protection layer pattern or at least one mold (layer pattern). Thus, the manufacturing coat and yield of the semiconductor device may be considerably reduced.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The invention is defined by the following claims, with equivalents of the claims to be included therein.

What is claimed is:

1. A method of manufacturing a semiconductor device, comprising:
   forming a tunnel insulation layer on a substrate;
   forming a charge trapping layer on the tunnel insulation layer;
   forming a protection layer pattern on the charge trapping layer;
   forming charge trapping layer patterns on the tunnel insulation layer by etching the charge trapping layer using the protection layer pattern, the charge trapping layer patterns being spaced apart from each other;
   forming blocking layers along sidewalls of the charge trapping layer patterns, respectively; and
   forming a gate electrode on the blocking layers and the tunnel insulation layer using the protection layer pattern.

2. The method of claim 1, wherein forming the charge trapping layer patterns comprises:
   forming first charge trapping layer patterns between the tunnel insulation layer and the protection layer pattern; and
   forming second charge trapping layer patterns on sidewalls of the first charge trapping layer patterns.

3. The method of claim 2, wherein the second charge trapping layer patterns have round etched profiles.

4. The method of claim 2, further comprising:
   removing the protection layer pattern and the first charge trapping layer patterns after forming the gate electrode.

5. The method of claim 1, further comprising:
   forming gate spacers on sidewalls of the gate electrode, the charge trapping layer patterns and the blocking layers.

6. The method of claim 1, wherein the charge trapping layer includes nitride and the protection layer pattern includes oxide.

7. The method of claim 6, wherein the blocking layers include metal oxide and the gate electrode includes metal and/or metal compound.

8. The method of claim 1, wherein the charge trapping layer patterns are formed by etching the charge trapping layer until the tunnel insulation layer is exposed.

9. The method of claim 1, wherein the blocking layers are formed only on the charge trapping layer patterns.

10. The method of claim 1, where the blocking layers are formed such that the blocking layers do not cover the tunnel insulation layer.

11. The method of claim 1, wherein the blocking layers are formed such that the blocking layers do not cover side surfaces of sidewalls of the protection layer pattern.

12. The method of claim 11, wherein the blocking layers are formed such that the blocking layers are not on upper surfaces of the sidewalls of the protection layer pattern.

13. A method of manufacturing a semiconductor device, comprising:
   forming a tunnel insulation layer on a substrate;
   forming at least one mold on the tunnel insulation layer;
   forming a charge trapping layer on the at least one mold and the tunnel insulation layer;
   forming charge trapping layer patterns on the tunnel insulation layer by etching the charge trapping layer using the at least one mold, the charge trapping layer patterns being spaced apart from each other;
   forming blocking layers on the charge trapping layer patterns; and
   forming a gate electrode on the blocking layers and the tunnel insulation layer using the at least one mold.

14. The method of claim 13, wherein the at least one mold includes polysilicon, carbon, silicon oxide or silicon oxynitride.

15. The method of claim 13, wherein forming the at least one mold comprises:
    forming a mold layer on the tunnel insulation layer; and
    patterning the mold layer.

16. The method of claim 15, wherein the charge trapping layer is conformally formed along profiles of the at least one mold and the tunnel insulation layer.

17. The method of claim 13, wherein forming the at least one mold comprises:
    forming a mold layer on the tunnel insulation layer;
    forming a first mold on a first portion of the tunnel insulation layer in a peripheral circuit area of the substrate; and
    forming second molds on a second portion of the tunnel insulation layer in a cell area of the substrate.

18. The method of claim 17, wherein the charge trapping layer patterns are formed on sidewalls of the first mold and the second molds.

19. The method of claim 17, further comprising:
    partially removing the first mold and the tunnel insulation layer to expose a portion of the substrate in the peripheral circuit area;
    forming a gate insulation layer on the exposed portion of the substrate.

20. The method of claim 19, further comprising:
    forming an additional gate electrode on the gate insulation layer;
    forming a first spacer on a sidewall of the additional gate electrode; and
    forming a second gate spacer on sidewalls of the gate electrode, the blocking layers and the charge trapping layer patterns.

* * * * *